(12) United States Patent
Yamamoto et al.

(10) Patent No.: US 7,027,327 B2
(45) Date of Patent: Apr. 11, 2006

(54) NON-VOLATILE MEMORY

(75) Inventors: Shinichi Yamamoto, Hirakata (JP); Kazufumi Ogawa, Nara (JP); Norihisa Mino, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/486,628

(22) PCT Filed: Dec. 16, 2002

(86) PCT No.: PCT/JP02/13115

§ 371 (c)(1),
(2), (4) Date: Feb. 11, 2004

(87) PCT Pub. No.: WO03/052827

PCT Pub. Date: Jun. 26, 2003

(65) Prior Publication Data
US 2004/0196688 A1    Oct. 7, 2004

(30) Foreign Application Priority Data
Dec. 18, 2001   (JP)   ............................. 2001-384307
Feb. 15, 2002   (JP)   ............................. 2002-039332
Sep. 24, 2002   (JP)   ............................. 2002-278076

(51) Int. Cl.
*G11C 11/34* (2006.01)
(52) U.S. Cl. .................. 365/184; 365/148; 365/175
(58) Field of Classification Search ................ 365/184, 365/148, 189.01, 161, 151, 175
See application file for complete search history.

(56) References Cited

U.S. PATENT DOCUMENTS 5,418,743 A * 5/1995 Tomioka et al. ............ 365/184
5,621,683 A   4/1997 Young

FOREIGN PATENT DOCUMENTS

| EP | 0 528 662 | 2/1993 |
| JP | 2-58240 | 2/1990 |
| JP | 2-239664 | 9/1990 |
| JP | 3-289169 | 12/1991 |
| JP | 5-28549 | 2/1993 |
| WO | 01/73845 | 10/2001 |

* cited by examiner

*Primary Examiner*—David Lam
(74) *Attorney, Agent, or Firm*—Hamre, Schumann, Mueller & Larson, P.C.

(57) ABSTRACT

A nonvolatile memory includes at least a first electrode (71) and a second electrode (72) provided on a substrate, the first and second electrodes being separated from each other, and a conductive organic thin film (73) for electrically connecting the first and second electrodes. The conductive organic thin film (73) has a first electric state in which it exhibits a first resistance, and a second electric state in which it exhibits a second resistance. A first threshold voltage for a transition from the first electric state to the second electric state, and a second threshold voltage for a transition from the second electric state to the first electric state are different from each other, and either the first electric state or the second electric state is maintained a voltage in a range between the first threshold voltage and the second threshold voltage.

21 Claims, 28 Drawing Sheets

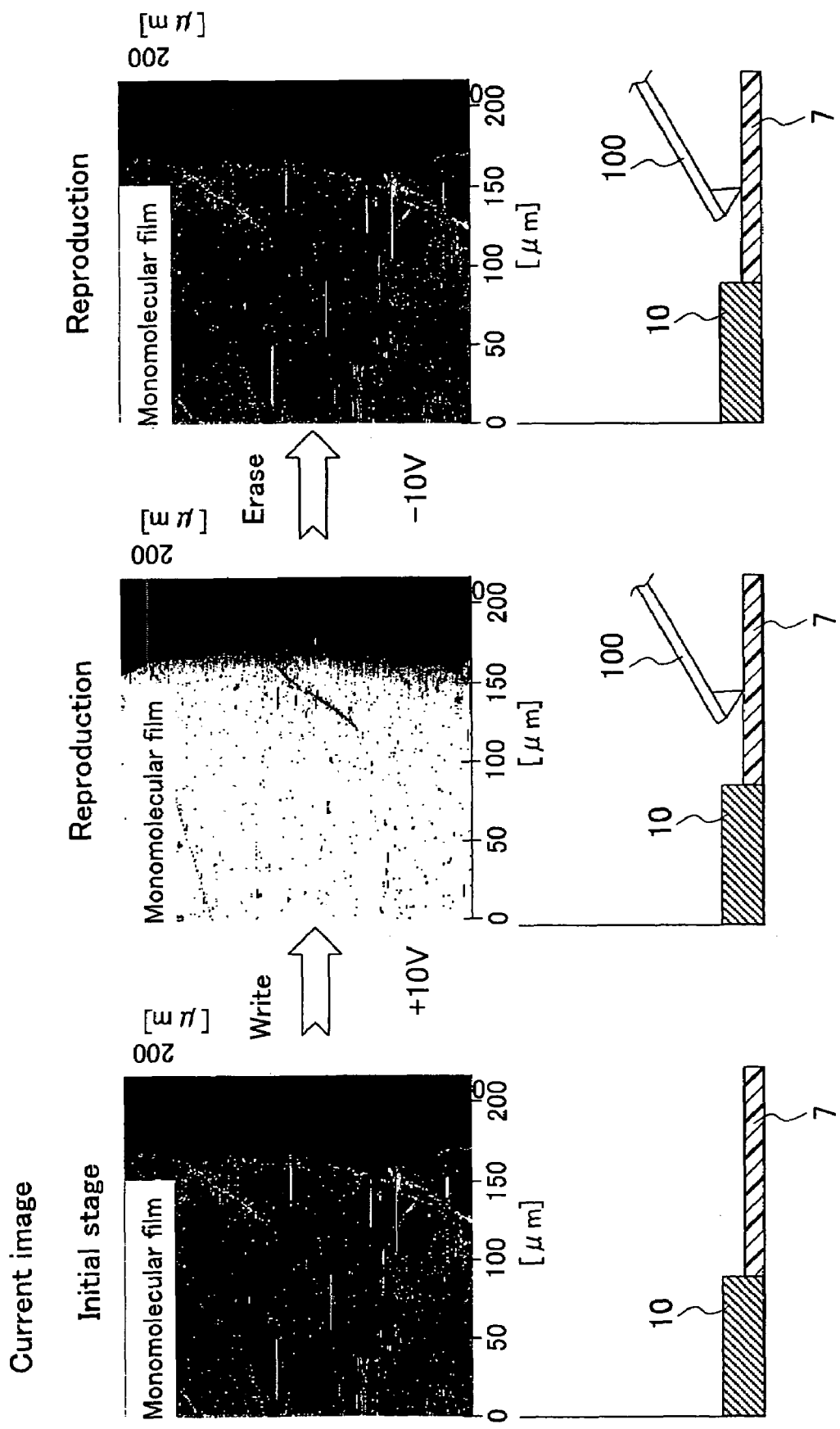

$C_4H_4N-(CH_2)_6-OCO-(CH_2)_{10}-Si(-O-)_3$
is expressed as

NON-VOLATILE MEMORY

TECHNICAL FIELD

The present invention relates to a nonvolatile memory including a conductive organic thin film. More specifically, it relates to a nonvolatile memory, as an application example of a memory, suitable for use in a memory card or a computer system, as an auxiliary storage medium that maintains information even after the power is turned off, and hence, does not need backup with the use of batteries.

BACKGROUND ART

Recently, the increasing demand for computers, particularly personal computers (hereinafter abbreviated as "PC"), in response to an explosive expansion of the Internet has caused the industries in the field to develop rapidly. The market has demanded products of higher performance and lower costs, which leads to a fierce competition on the supply side that has been trying to meet the demand. One of the significant factors in determining the performance of a computer is a storage device, and the mainstream of the same is a semiconductor memory configured so that memory cells are formed on a semiconductor substrate such as silicon. The main requirements for the high performance of the semiconductor memory are "high speed of input/output to/from memory", "large capacity of memory", and "stability of storage". Computers may have various configurations to meet various demands of the market, but in the case where both of the higher speed and the larger capacity are pursued, the cost rises, whereas in the case where a compromise is made by giving up either of the two, the cost can be reduced.

Currently, the most common memories built in PCs are configured so that cache memories and main memories are composed of RAMs (random access memories), and examples of memories used as such include DRAMs (dynamic random access memories) and SRAMs (static random access memories).

A DRAM has a larger capacity per unit area as compared with a SRAM and is manufactured at a lower cost, whereas it has a problem that an output of memory takes time since the retrieval of memory is carried out by discharging electric charges, and moreover, the supply of charges (refresh) is required at all times.

On the other hand, in the case of a SRAM, since the retrieval of memory therefrom is carried out by determining a state of a multivibrator, refreshing is not required, and the reading is performed at a high speed. However, because of a complex structure thereof, the SRAM has a smaller capacity per unit area, and is expensive, as compared with a DRAM.

Therefore, a common memory configuration in a PC is such that a SRAM is used as a cache memory and a DRAM is used as a main memory so that the cost is suppressed. Further, since the memory in the DRAM and SRAM disappears when the power is turned off, necessary memory has to be stored in another storage device such as a disk. Examples of storage devices in which memory is not lost even after the power is turned off include a flash memory, but considering its need for high voltage upon input, its limited capacity, and its cost, it hardly satisfies the above-described demands of the market at the present time.

For the downsizing and speed enhancement of a computer, a storage device in the computer has to have a large capacity. As to a DRAM as a typical internal memory, the dense packaging has been attempted by reducing the cell size, but insufficient capacity of a capacitor has been a problem. More specifically, though various cell structures have been studied for increasing an electrode area, they are significantly complex structures, and there arise problems such as an increase in the cost per one bit and an increased ratio of defects that occur during manufacturing.

As a conventional example, a scheme for recording/reproducing information in/from a medium by detecting current flowing through an element with use of a probe electrode has been proposed, the medium being obtained by laminating a recording film having an electric memory effect on an amorphous carbon layer formed on a substrate electrode (JP 5(1993)-28549A).

However, in the foregoing scheme, the organic film is not chemically bonded with a surface of a substrate and is separated therefrom easily. Additionally, it needs further improvement regarding electric characteristics.

DISCLOSURE OF THE INVENTION

It is an object of the present invention to provide a nonvolatile memory that not only allows writing/reading of record to be performed utilizing a change in an electrical resistance of a conductive organic thin film, but also can be densely packaged.

To achieve the foregoing object, a nonvolatile memory of the present invention includes:

at least a first electrode and a second electrode provided on a substrate, the first and second electrodes being separated from each other; and a conductive organic thin film for electrically connecting the first and second electrodes, wherein the conductive organic thin film has a first electric state in which it exhibits a first resistance, and a second electric state in which it exhibits a second resistance, a first threshold voltage for a transition from the first electric state to the second electric state, and a second threshold voltage for a transition from the second electric state to the first electric state are different from each other, either the first electric state or the second electric state is maintained at a voltage in a range between the first threshold voltage and the second threshold voltage, the conductive organic thin film is formed with organic molecules, each of which includes:

a terminal binding group that is bound with a surface of the substrate or a surface of an insulation layer on the substrate by a covalent bond; and a conjugate group, and, each conjugate group is polymerized with another conjugate group of another organic molecule so as to form the conductive organic thin film.

Further, another nonvolatile memory of the present invention is configured so that the first electrode is a source electrode and the second electrode is a drain electrode, the nonvolatile memory further comprising a gate electrode, a contact electrode, and a horizontal selection line, wherein the contact electrode is connected with the horizontal selection line, the source electrode and the drain electrode are arranged to extend in a direction crossing the horizontal selection line orthogonally, the gate electrode is arranged at a position above or below a region between the source electrode and the drain electrode, the position being apart from the source electrode and the drain electrode, the conductive organic thin films are arranged so as to electrically connect the contact electrode, the source electrode, and the drain electrode, and the conductive organic thin film arranged between the contact electrode and the source electrode forms a memory part.

BRIEF DESCRIPTION OF DRAWINGS

FIGS. 5A to 5C are views obtained by measurement of conductive organic thin films by AFM in examples of the present invention.

DESCRIPTION OF THE INVENTION

Figure 1:
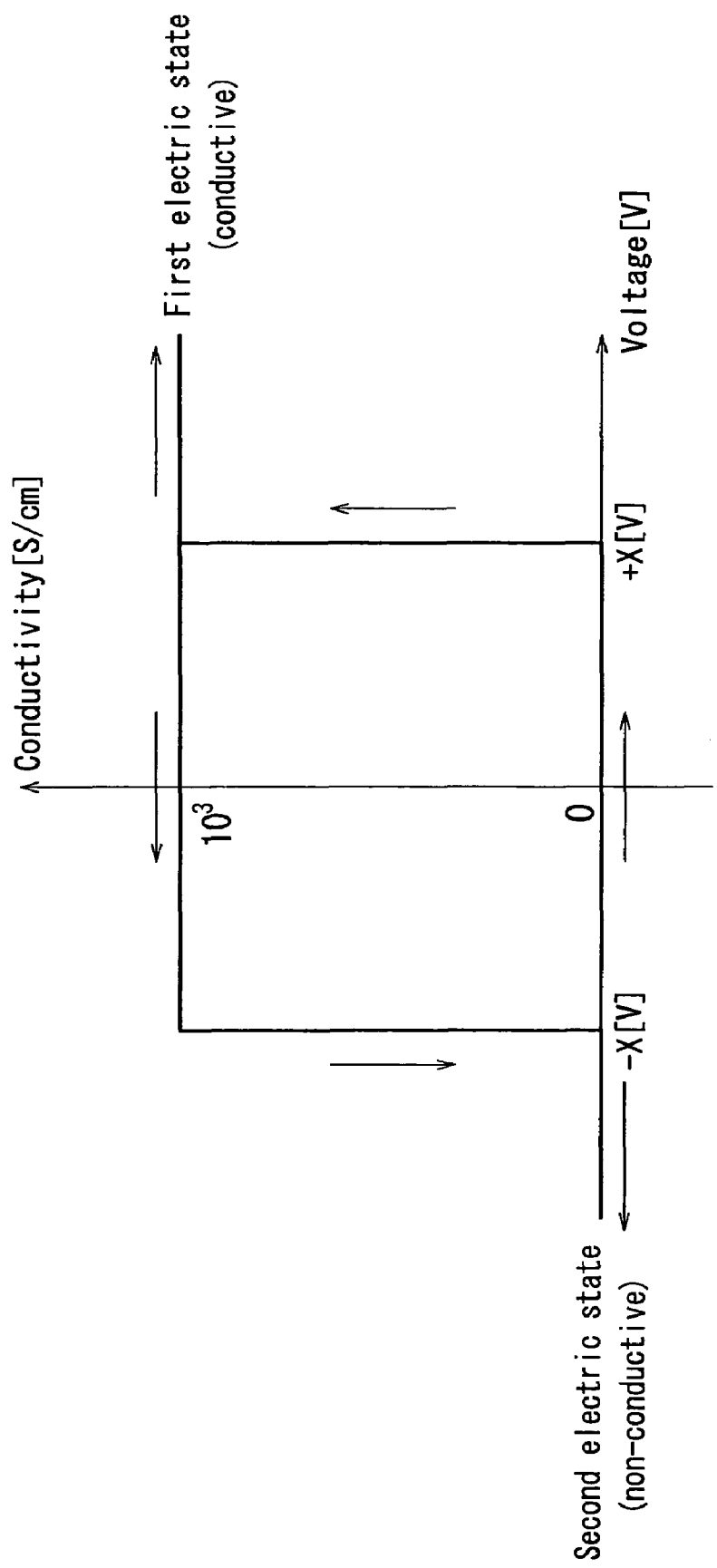
FIG. 1 is a graph showing an electric behavior of a conductive organic thin film in an example of the present invention.

In the present invention, a memory cell is used that employs an organic film having at least a first conductivity and a second conductivity, to which at least a first electrode and a second electrode are connected as to be used as input/output terminals, so that the recording, reproduction, and erasure of information is performed using the difference in the conductivity of the organic film. By so doing, the present invention provides a memory with a simpler element configuration.

In the present invention, the conductivity of an organic thin film is attributed to molecules composing an organic molecule aggregate being polymerized with one another by conjugated bonds. In the film, a conductive organic thin film (hereinafter also referred to as a "conductive network") is formed by a polymer that is an aggregate of organic molecules bound with one another by conjugate bonds that are responsible for electrical conductivity, thereby having conjugated bond chains (conjugated system). Further, the conductive network is formed so as to extend between electrodes. The conjugated bond chain polymer does not range strictly in one direction, but preferably polymer chains extending in various directions are formed.

In the present invention, a conductivity ($\rho$) of the conductive organic thin film is not less than 1 S/cm, preferably not less than $1 \times 10^3$ S/cm, more preferably not less than $5.5 \times 10^5$ S/cm, most preferably not less than $1 \times 10^7$ S/cm. These are values under the following conditions: room temperature (25° C.); relative humidity of 60%; and no dopant.

The conjugate group that functions in the polymerization preferably is at least one selected from conjugate groups that function in forming polypyrrole, polythienylene, polyacetylene, polydiacetylene, and polyacene. In the case where a thin film has conjugate groups that function in forming polypyrrole or polythienylene and is formed by electrolytic oxidation polymerization, the thin film has a high conductivity.

The terminal binding group preferably forms at least one type of bond selected from a siloxane-type (—SiO—) bond and a SiN— type bond.

The terminal binding group is formed by at least one elimination reaction selected from the dehydrochlorination, the dealcoholization, and the deisocyanation. For instance, in the case where a functional group at a terminal of a molecule is —SiCl₃, —Si(OR)₃ (where R is an alkyl group having one to three carbon atoms), or —Si(NCO)₃, while an active hydrogen included in a —OH group, a —CHO group, a —COOH group, a —NH₂ group, a >NH group, etc. is present on a surface of the substrate or a surface of a primer coating formed on the substrate, one of dehydrochlorination, dealcoholization, and deisocyanation occurs, whereby chemisorption molecules are bound by covalent bonds with the surface of the substrate or the surface of the primer coating formed on the substrate.

The molecular film formed by this method usually is called "chemisorption film" or "self-assembling film" in the art, but herein it is referred to as "chemisorption film", and a method for forming the same is referred to as "chemisorption method".

In the present invention, the alignment of the molecules preferably is achieved by at least one type of process selected from: an alignment process by rubbing; a tilt draining process of lifting up a substrate with a tilt out of a reaction solution after molecules are bound with a surface of the substrate by covalent bonds through an elimination reaction; a polarized-light projecting process; and an alignment process utilizing fluctuations of molecules in a polymerization process.

The conductive organic thin film preferably is transparent with respect to light having a wavelength in a visible range. This is because it has a thickness in the nanometer order (normally not more than 10 nm, even after molecular modification, not more than 50 nm), which is much smaller than a wavelength in a visible light wavelength range (300 nm to 800 nm).

A molecular unit composing the conductive organic thin film preferably is expressed by, for instance, a formula (1) shown below:

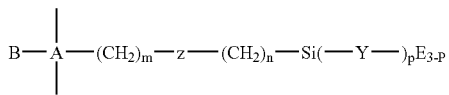

(1)

where

B represents hydrogen, an organic group including an alkyl group having one to ten carbon atoms, an active hydrogen introducible group, or its residue, A represents at least one conjugate bond selected from a pyrrole group, a thienylene group, an acetylene group (an ethynyl group), and a diacetylene group (a diethynyl group), Z represents at least one functional group selected from an ester group (—COO—), an oxycarbonyl group (—OCO—), a carbonyl group (—CO—), a carbonate group (—OCOO—), and an azo group (—N=N—), or a chemical bond (—), m and n represent integers satisfying 2≦m+n≦25, Y represents oxygen (O) or nitrogen (N), E represents hydrogen or an alkyl group having one to three carbon atoms, and p represents an integer of 1, 2, or 3.

More specifically, molecule units expressed by chemical formulae (2) to (5) shown below are preferable:

(2)

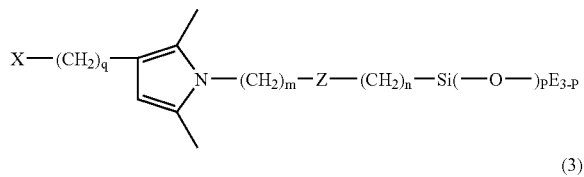

(3)

(4)

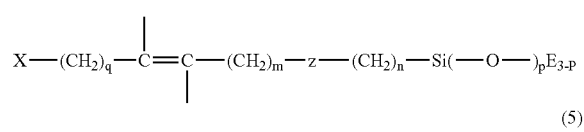

(5)

where

X represents hydrogen or an organic group containing an unsaturated group, q represents an integer of 0 to 10, Z represents an ester group (—COO—), an oxycarbonyl group (—OCO—), a carbonyl group (—CO—), a carbonate group (—OCOO—), and an azo group (—N=N—), or a chemical bond (—), E represents hydrogen or an alkyl group having one to three carbon atoms, m and n represent integers satisfying 2≦m+n≦25, preferably 10≦m+n≦20, and p represents an integer of 1, 2, or 3.

A chemical compound used for forming the conductive organic thin film preferably is expressed by a chemical formula (6) shown below:

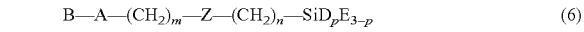

(6)

where

B represents hydrogen, an organic group including an alkyl group having one to ten carbon atoms, or an active hydrogen introducible group, A represents at least one conjugate bond selected from a pyrrole group, a thienylene group, an acetylene group, and a diacetylene group, Z represents at least one functional group selected from an ester group (—COO—), an oxycarbonyl group (—OCO—), a carbonyl group (—CO—), a carbonate group (—OCOO—), and an azo group (—N=N—), or a chemical bond (—), m and n represent integers satisfying 2≦m+n≦25, D represents at least one reactive group selected from a halogen atom, an isocyanate group, and an alkoxyl group having one to three carbon atoms, E represents hydrogen or an alkyl group having one to three carbon atoms, and p represents an integer of 1, 2, or 3.

Further specifically, preferable examples of the chemical compound include: a pyrrolyl compound expressed by a chemical formula (7) shown below, a thienyl compound expressed by a chemical formula (8) shown below, an ethynyl compound expressed by a chemical formula (9) shown below (also referred to as a chemical compound containing an acetylene group), and a diethynyl compound expressed by a chemical formula (10) shown below (also referred to as a chemical compound containing a diacetylene group):

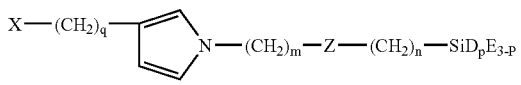
(7)

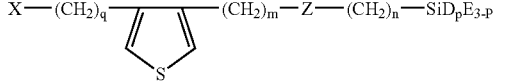
(8)

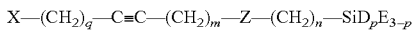
(9)

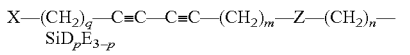
(10)

where

X represents hydrogen or an organic group containing an unsaturated group, q represents an integer of 0 to 10, D represents a halogen atom, an isocyanate group, or an alkoxyl group having one to three carbon atoms, E represents hydrogen or an alkyl group having one to three carbon atoms, n represents an integer of not less than 2 and not more than 25, and p represents an integer of 1, 2, or 3.

The organic molecules preferably are formed in a monomolecular layer.

Alternatively, a plurality of the monomolecular films may be laminated on one another by repeating a process for forming the foregoing monomolecular film a plurality of times, so that a monomolecular built-up film is formed.

In the foregoing chemical formula (B), in the case where X contains an unsaturated group such as a vinyl bond, a hydroxyl group (—OH) can be introduced by, for instance, projecting an energy beam such as electron beam or an X-ray beam in an atmosphere containing moisture, and —COOH can be introduced by immersion in an aqueous solution of potassium permanganate. Other methods also are available such as, for instance, the oxygen plasma treatment, the UV/ozone treatment, the corona treatment, and the treatment by immersion in a mixture solution of concentrated sulfuric acid and potassium dichromate (chromium mixed acid solution treatment). Such a treatment allows an active hydrogen to be introduced, thereby allowing monomolecular films to be accumulated and bound further.

Further alternatively, after the formation of the monomolecular layer and the tilting (alignment) are repeated alternately, the conductive networks may be formed simultaneously in respective monomolecular layers in a monomolecular build-up film in a process for forming the conductive network, so that a conductive monomolecular build-up film is formed.

Alternatively, a series of the monomolecular layer formation, the tilting, and the conductive network formation may be repeated so that a conductive monomolecular build-up film is formed.

A polymerizing method is at least one type selected from electrolytic oxidation polymerization, catalytic polymerization, and energy beam polymerization. Before the formation of the conductive network by electrolytic oxidation polymerization, preliminary polymerization of at least one type selected from catalytic polymerization and energy beam polymerization, may be carried out.

The energy beam preferably is at least one selected from ultraviolet rays, far-ultraviolet rays, X-rays, and an electric beam.

The energy beam may be at least one selected from polarized ultraviolet rays, polarized far-ultraviolet rays, and polarized X-rays, and the tilting and the conductive network formation may be carried out simultaneously.

As the organic molecule includes a polar functional group, the sensitivity with respect to an electric field applied thereto is enhanced and the response speed is increased, whereby the conductivity of the organic thin film can be varied rapidly. The variation of the conductivity of the organic thin film is considered to be caused in the following manner: upon application of an electric field, a polar functional group responds to the electric field, and the structure of the conductive network is influenced by the response.

Still further, by doping a charge-transfer-type dopant substance in the conductive network, it is possible to enhance the conductivity further. As the dopant substance, any dopant substance may be used, such as iodine, $BF^-$ ion, alkali metals such as Na and K, alkaline earth metals such as Ca, etc. Further, other dopant substances may be included, as a result of being mixed unavoidably due to contamination from trace components contained in a solution used an organic film forming process, from a glass container, and the like.

Since the organic molecules composing a conductive monomolecular layer are in a highly aligned state, consequently conjugate bond chains of the conductive network are present in a specific plane. Therefore, the conductive network formed in the monomolecular layer linearly ranges in a predetermined direction. The linearity of the conductive network provides a high conductivity anisotropy. Further, the linearity of the conductive network indicates that conjugate bond chains (conjugated systems) composing the conductive network are arrayed substantially in parallel in the same plane within the monomolecular layer. Therefore, the conductive monomolecular layer has a high and uniform conductivity. Furthermore, the linearity of the conductive network causes conjugate bond chains with a high degree of polymerization to be present in a monomolecular layer.

According to the foregoing example, it is possible to provide a conductive monomolecular film and a conductive monomolecular build-up film with a significantly enhanced conductivity even if it has a small film thickness.

In the case of a conductive monomolecular build-up film, since conductive networks are formed in respective conductive monomolecular layers, the conductivity of the conductive network of the monomolecular build-up film depends on the number of monomolecular films thus stacked. Therefore, it is possible to provide a conductive organic thin film having a desired conductivity by changing the number of the conductive monomolecular layers composing the film. For instance, in the case of a conductive build-up film obtained by stacking the same conductive monomolecular layers, the conductivity of the conductive network included therein is substantially proportional to the number of layers.

As long as all the directions of the conductive networks formed in the monomolecular layers are uniform in the conductive monomolecular build-up film, the respective tilt angles of aligned organic molecules in the monomolecular layers may be different from one layer to another. Further, all the monomolecular layers need not be composed of the same organic molecules. Still further, the conductive monomolecular build-up film may be composed of conductive monomolecular layers in which respective types of organic molecules forming the conductive monomolecular layers are different from one layer to another.

Further, in the case of a conductive monomolecular build-up film, the conductive monomolecular layer closest to the substrate is bound to the substrate by chemical bonds, it provides excellent durability such as excellent spalling resistance.

The tilting direction of organic molecules in the tilting step is defined as a direction of a line segment obtained by projecting a major axis of an organic molecule to a surface of the substrate. Therefore, the tilting angles with respect to the substrate need not be uniform.

In the tilting process, it is possible to tilt an aggregate of organic molecules composing the monomolecular layer with high accuracy in a predetermined direction. Generally, it is possible to align molecules composing a monomolecular layer. Since this provides accurate alignment, it is possible to form a conductive network having a directivity in the conductive network formation easily.

The tilting may be carried out by applying any one of the tilt draining, rubbing, light projection, and alignment utilizing fluctuations of molecules in a solution during polymerization, or alternatively, by applying a plurality of the same in combination by carrying out the same successively. To form a monomolecular film aligned in an accurately aligned state by employing different alignment methods in combination, a rubbing direction, a polarization direction, and a tilt draining direction preferably are made to coincide with one another.

Furthermore, by binding aligned organic molecules in the monomolecular layer by conjugated bonds, it is possible to form a conductive network that has a high degree of polymerization and ranges linearly. Furthermore, with the linearity of the conductive network, it is possible to form a homogeneous conductive monomolecular layer.

In the foregoing example, a polarized light having a wavelength in a range of visible light is used as the polarized light. According to this example, the spalling of the organic molecules composing the organic thin film, and breakdown of the organic thin film due to the breakdown of organic molecules themselves can be prevented or controlled.

According to the foregoing example, in the case where the organic thin film is formed on a surface of the substrate having been subjected to a rubbing process, the organic molecules composing the organic thin film exhibit a state of being tilted in a predetermined direction. Generally, a rubbing direction in the rubbing process and a tilting direction of the organic molecules of a film formed coincide with each other.

A cloth made of nylon or rayon can be used as a rubbing cloth used in the rubbing process. As in the configuration described above, the use of a rubbing cloth made of nylon or rayon is suitable for the purpose of improving the accuracy of the alignment.

One or more types of polymerization methods may be applied in the foregoing conductive network formation, so that the molecules composing the organic thin film are polymerized, or polymerized and linked after the polymerization, by conjugated bonds, whereby the conductive network is formed. In this example, a conductive network that allows for electric conduction can be formed by binding the polymerizable groups of the organic molecules by conjugated bonds. As the polymerization method, at least one selected from electrolytic polymerization, catalytic polymerization, and energy beam polymerization can be used. The electrolytic oxidation polymerization may be carried out in particular at the final step for completing the conductive network, whereby a high conductivity can be obtained.

Furthermore, in the case where each of the molecules forming the organic thin film has a plurality of polymerizable groups that are bound by conjugated bonds, a linking reaction is caused further in a polymer formed by polymerization of the polymerizable groups of one of the two kinds, so that the polymerizable groups of the other kind are bound by conjugated bonds. By so doing, a conductive network having a structure different from that after the polymerization can be formed. Here, the polymerizable groups of the other kind that are present in side chains of the polymer formed by the polymerization are linked with one another.

For instance, a monomolecular film is formed with an aggregate of organic molecules each having a diacetylene group, the monomolecular film is subjected to catalytic polymerization, and further, it is subjected to the energy beam polymerization for linking. By so doing, a conductive network including a polyacene-type conjugate system having an extremely high conductivity can be formed.

In the foregoing step of polymerization, the polymerization method selected from the group consisting of catalytic polymerization, electrolytic polymerization, and energy beam polymerization may be applied. In this example, a conductive network can be formed by applying catalytic polymerization to an organic thin film composed of organic molecules having polymerizable groups with catalyst polymerizability (hereinafter referred to as catalyst-polymerizable group), by applying the electrolytic polymerization to an organic thin film composed of organic molecules having polymerizable groups with electrolytic polymerizability (hereinafter referred to as electrolytic-polymerizable group), or by applying the energy beam polymerization to an organic thin film composed of organic molecules having polymerizable groups that are polymerized when being irradiated with an energy beam (hereinafter referred to as energy-beam-polymerizable group). To form a conductive network efficiently, the catalyst polymerization and/or the energy beam polymerization is carried out first, and the reaction is completed by electrolytic oxidation polymerization at the final stage.

In the case where a set of plural linking steps is employed, it may be a combination of linking steps by different effects, but examples of the same also include a combination of steps by the same effect under different reaction conditions. For instance, a conductive network may be formed by carrying out a linking step by projecting an energy beam of a first type after the linking step by the catalyst effect, and thereafter, carrying out a linking step by projecting an energy beam of a second type.

In the foregoing conductive network formation, the catalytic polymerization is applied as the polymerization method, and a conductive network is formed in an organic thin film that is formed with an aggregate of organic molecules having pyrrole groups, thienylene groups, acetylene groups, or diacetylene groups, as the polymerizable groups.

For instance, a conductive network including a polypyrrole-type conjugate system can be formed using organic molecules having pyrrole groups, and a conductive network including a polythienylene-type conjugate system can be formed using organic molecules having thienylene groups.

In the foregoing conductive network forming step, it also is possible to form a conductive network by the energy beam polymerization in the organic thin film formed with an aggregate of organic molecules having acetylene groups or diacetylene groups as the polymerizable groups. In this example, a conductive network having a polyacetylene-type conjugate system can be formed by using organic molecules having acetylene groups as the organic molecules composing the organic thin film. On the other hand, a conductive network having a polydiacetylene type conjugate system or a polyacene-type conjugate system can be formed by using organic molecules having diacetylene groups.

Ultraviolet rays, far-ultraviolet rays, X-rays, or an electric beam may be used as the foregoing energy beam. In this example, a conductive network can be formed efficiently. Further, since the absorption characteristics are different according to the type of the beam-irradiation-polymerizable groups, the reaction efficiency can be enhanced by selecting a type of an energy beam and energy that allow for the improvement of the absorption efficiency. Furthermore, since many beam irradiation polymerizable groups exhibit absorbing properties with respect to such energy beams, it is applicable to organic thin films formed with organic molecules having various types of beam-irradiation-polymerizable groups.

Furthermore, polarized ultraviolet rays, polarized far-ultraviolet rays, or polarized X-rays may be used as the foregoing energy beam, and the tilting step and the conductive network forming step may be carried out simultaneously. In this example, the organic molecules forming an organic thin film can be tilted in a predetermined direction (aligned), and the organic molecules can be bound with one another via conjugated bonds. Therefore, the process can be simplified.

The substrate used in the present invention is made of glass, a resin, a metal, ceramic, etc., and in the case where it has active hydrogen on its surface, it can be used as it is. In the case of a substrate with less active-hydrogen on its surface, the substrate is treated with $SiCl_4$, $HSiCl_3$, $SiCl_3O-(SiCl_2-O)_n-SiCl_3$ (where n is an integer of not less than 0 and not more than 6), $Si(OCH_3)_4$, $HSi(OH_3)_3$, $Si(OCH_3)_3O-(Si(OCH_3)_2-O)_n-Si(OCH_3)_3$ (where n is an integer of not less than 0 and not more than 6), or the like. These chemical compounds can be formed by chemisorption, and they preferably are formed so as to have a film thickness of approximately 1 nm to 10 nm, since such a thickness does not impair the transparency. Alternatively, a silica film or an $Al_2O_3$ film may be formed thereon by vapor deposition, or active hydrogen may be imparted by activating the substrate surface by corona discharge, plasma projection, etc.

In the present invention, an organic film memory as a nonvolatile memory is composed of an organic film as a storage medium, a first line arranged in the vicinity of the organic film for brining the organic film into conduction, and a second line arranged in the vicinity of the organic film for detecting whether the organic film is conductive or non-conductive.

Further, a memory input/output method is configured in the following manner. Organic films are used as storage media, and for each of the organic films, at least one line for bringing the organic film into conduction is arranged in the vicinity of the organic film so that memory is written by bringing the organic film into conduction using the line. Further, for each of the organic films, at least one line for detecting the conduction of the organic film is arranged in the vicinity of the organic film so that memory is read.

Further, the substrate of the present invention refers to, apart from an entire substance having insulation surfaces, unless provided otherwise, not only substrates made of insulation materials such as a glass substrate, a resin substrate, a resin film, etc., but also substrates made of semiconductors, metals, etc.

The first or second electric state is maintained by applying a predetermined voltage across the electrodes. For instance, a first electric state is maintained by applying a voltage of not lower than +10 V, while a second electric state is maintained by applying a voltage of not lower than −10 V.

The first or second electric state also can be maintained by passing a predetermined current through the organic film.

The first and second lines may be formed either substantially orthogonally with each other or in matrix form.

In a method of the present invention, polymerization preferably is electrolytic polymerization.

The foregoing linear electric conductors and the organic film may be electrically continuous via a contact hole that passes therethrough.

The organic film may be extended through the contact hole, and an outputting operation of the organic film may be carried out by carrying a first current.

Further, the organic film and the first line may be formed on the substrate, and insulation films may be formed on at least a part of the first line and at least a part of the substrate, while the second line may be formed so as to cross the first line substantially orthogonally.

Further, a plurality of holes or grooves may be formed in at least a part of the foregoing insulation films.

The following will describe electric behaviors of a preferable conductive organic thin film of the present invention, while referring to FIG. 1. A conductivity of the thin film, for instance, rises up to $10^3$ S/cm in response to a voltage of +10 V applied thereto, and this state in which the thin film is maintained is a first electric state. This is a conductive state. Then, in response to a voltage of −10 V applied thereto, the conductivity thereof drops to 0 S/cm, and this state in which the thin film is maintained is a second electric state. This is a non-conductive state. The threshold value thereof is plotted in a graph with a line in a substantially rectangular form.

As to an application example of the memory, the foregoing memory element is suitable for use in a memory card or a computer system, as an auxiliary storage medium that does not need backup with use of a battery, since the foregoing memory element stores information even after the power is turned off. Further, since it is nonvolatile, it is capable of functioning as a part of a HDD (hard disk). By using the memory element for the foregoing purposes, the following functions can be achieved:

(1) enhancing the speed for input/output of memory;
(2) facilitating the higher-density packaging, thereby producing large-capacity storage devices at lower cost; and
(3) not losing memory even when the power supply is stopped, thereby stably maintaining memory.

EXAMPLES

The following will describe the present invention specifically, while referring to examples thereof. In the Examples described below, "%" alone means "percent by mass".

Example of Synthesis of Chemisorption Molecules

First, a substance expressed by a chemical formula (11) shown below (PEN: 6-pyrrolylhexyl-12,12,12-trichloro-12-siladodecanoate), including a 1-pyrrolyl group ($C_4H_4N-$)

that is capable of forming a conductive network, an oxycarbonyl group (—OCO—) that is a polar functional group, and a trichlorosilyl group (—SiCl$_3$) that is dehydrochlorinated with active hydrogen (for instance, a hydroxyl group (—OH)) on the surface of the substrate, was synthesized through steps described below.

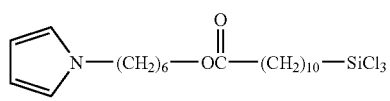
(11)

I. Method for Synthesizing the Substance (PEN) Expressed by the Chemical Formula (11)

Step 1: Synthesis of 6-bromo-1-(tetrahydropyranyloxy)hexane 197.8 g (1.09 mol) of 6-bromo-1-hexanol was put in a 500-ml reactor and was cooled to 5° C. or below. 102.1 g (1.21 mol) of dihydropyran was dropped thereto at a temperature of not higher than 10° C. After the dropping was finished, the mixture was returned to room temperature and stirred for one hour. Residue obtained as a result of the reaction was subjected to purification by silicagel column with use of hexane/diisopropyl ether (IPE)=5/1, whereby 263.4 g of 6-bromo-1-(tetrahydropyranyloxy)hexane was obtained. The yield of the same was 90.9%. The reaction of the step 1 is expressed by a formula (12) shown below:

Br—(CH$_2$)$_6$—OH→Br—(CH$_2$)$_6$—OTHP　　(12)

Step 2: Synthesis of N-[6-(tetrahydropyranyloxy)hexyl]pyrrole 38.0 g (0.567 mol) of pyrrole and 200 ml of dehydrated tetrahydrofuran (THF) was put in a 2-liter reactor under flow of argon, and was cooled to 5° C. or below. 354 ml (0.567 mol) of n-butyllithiumhexane solution of 1.6 M was dropped at 10° C. or below. After the mixture was stirred at the same temperature for one hour, 600 ml of dimethyl sulfoxide was added thereto, and THF was removed by heating and distilling, so that the solvent replacement was carried out. Next, 165 g (0.623 mol) of 6-bromo-1-(tetrahydropyranyloxy)hexane was dropped thereto at room temperature. After the dropping, the mixture was stirred at the same temperature for two hours.

600 mol of water was added to the reaction mixture, and the mixture was subjected to hexane extraction, so that an organic layer was washed with water. After drying the same using anhydrous magnesium sulfate, the solvent was removed by distilling. The residue obtained was subjected to purification by silicagel column with use of hexane/ethyl acetate=4/1, whereby 107.0 g of N-[6-(tetrahydropyranyloxy)hexyl]pyrrole was obtained. The yield was 75.2%. The reaction of the step 2 is expressed by a formula (13) shown below:

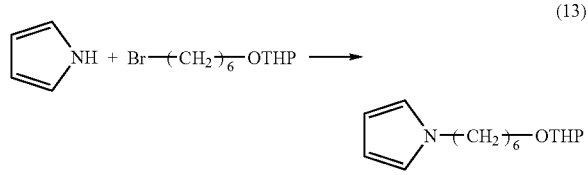
(13)

Step 3: Synthesis of N-(6-hydroxyhexyl)-pyrrole 105.0 g (0.418 mol) of N-[6-(tetrahydropyranyloxy)hexyl]pyrrole obtained as above, 450 ml of methanol, 225 ml of water, and 37.5 ml of concentrated hydrochloric acid were put in a 1-liter reactor, and were stirred for six hours at room temperature. The reaction mixture obtained was poured into 750 ml of concentrated brine, and was subjected to IPE extraction. An organic layer was washed with concentrated brine. After drying the same using anhydrous magnesium sulfate, the solvent was removed by distilling. The residue obtained was subjected to purification by silicagel column with use of n-hexane/ethyl acetate=3/1, whereby 63.1 g of N-(6-hydroxyhexyl)pyrrole was obtained. The yield was 90.3%. The reaction of the step 3 is expressed by a formula (14) shown below:

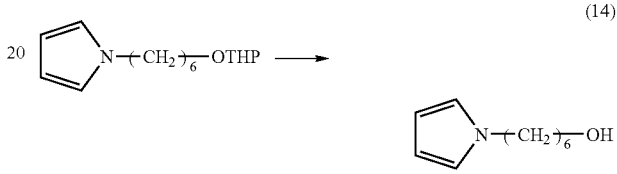
(14)

Step 4: Synthesis of N-[6-(10-undecenoyloxy)hexyl]-pyrrole 62.0 g (0.371 mol) of N-(6-hydroxyhexyl)-pyrrole, 33.2 g (0.420 mol) of dry pyridine, and 1850 ml of dry toluene were put in a 2-liter reactor, and 300 ml of a dry toluene solution of 75.7 g (0.373 mol) of 10-undecenoylchloride was dropped thereto at 20° C. or below. The dropping time was 30 minutes. Thereafter, the mixture was stirred at the same temperature for one hour. The reaction mixture was poured into 1.5 liter of iced water, and was made acidic with use of 1N hydrochloric acid. It was subjected to ethyl acetate extraction, an organic layer was washed with water and concentrated brine and was dried using anhydrous magnesium sulfate, and the solvent was removed. As a result, 128.2 g of crude substance was obtained. This was subjected to purification by silicagel column with use of n-hexane/acetone=20/1, whereby 99.6 g of N-[6-(10-undecenoyloxy)hexyl]-pyrrole was obtained. The yield was 80.1%. The reaction of the step 4 is expressed by a reaction formula (15) shown below:

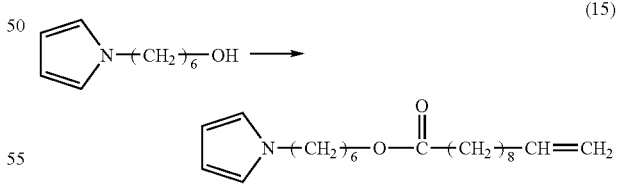
(15)

Step 5: Synthesis of PEN 2.0 g (6.0×10$^{-3}$ mol) of N-[6-(10-undecenoyloxy)hexyl]-pyrrole, 0.98 g (7.23×10$^{-3}$ mol) of trichlorosilane, and 0.01 g of 5% isopropyl alcohol solution of H$_2$PtCl$_6$·6H$_2$O were put in a 100-ml pressure-resistant test tube with a cap, and reaction was caused at 100° C. for 12 hours. After the reaction liquid was treated with activated carbon, low-boiling components were removed by distilling under a reduced pressure of 2.66×10$^3$ Pa (20 Torr). 2.3 g of PEN was obtained. The yield was 81.7%. The reaction of the step 5 is expressed by a reaction formula (16) shown below.

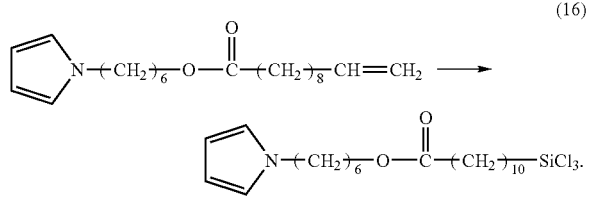

(16)

It should be noted that to substitute a trichlorosilyl group at a terminal with a trimethoxysilyl group, PEN expressed by the foregoing chemical formula is stirred with methyl alcohol in an amount three times the amount of PEN in molar terms at room temperature, so that dehydrochlorination occurs. Sodium hydroxide is added thereto as required so that the foregoing hydrogen chloride is separated as sodium chloride.

Figure 2:
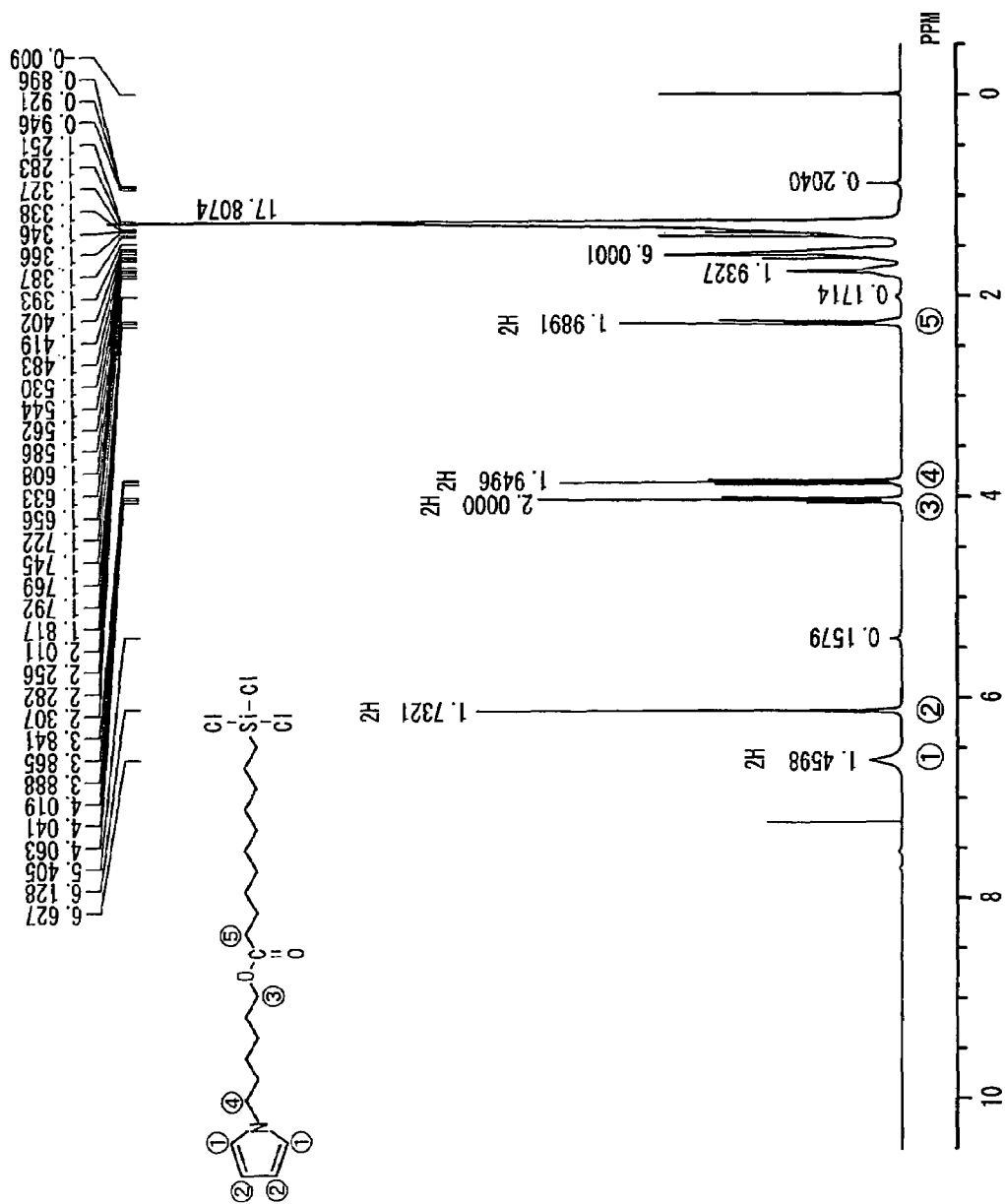
FIG. 2 is a NMR analysis chart of a pyrrole compound in the example of the present invention.
Figure 3:
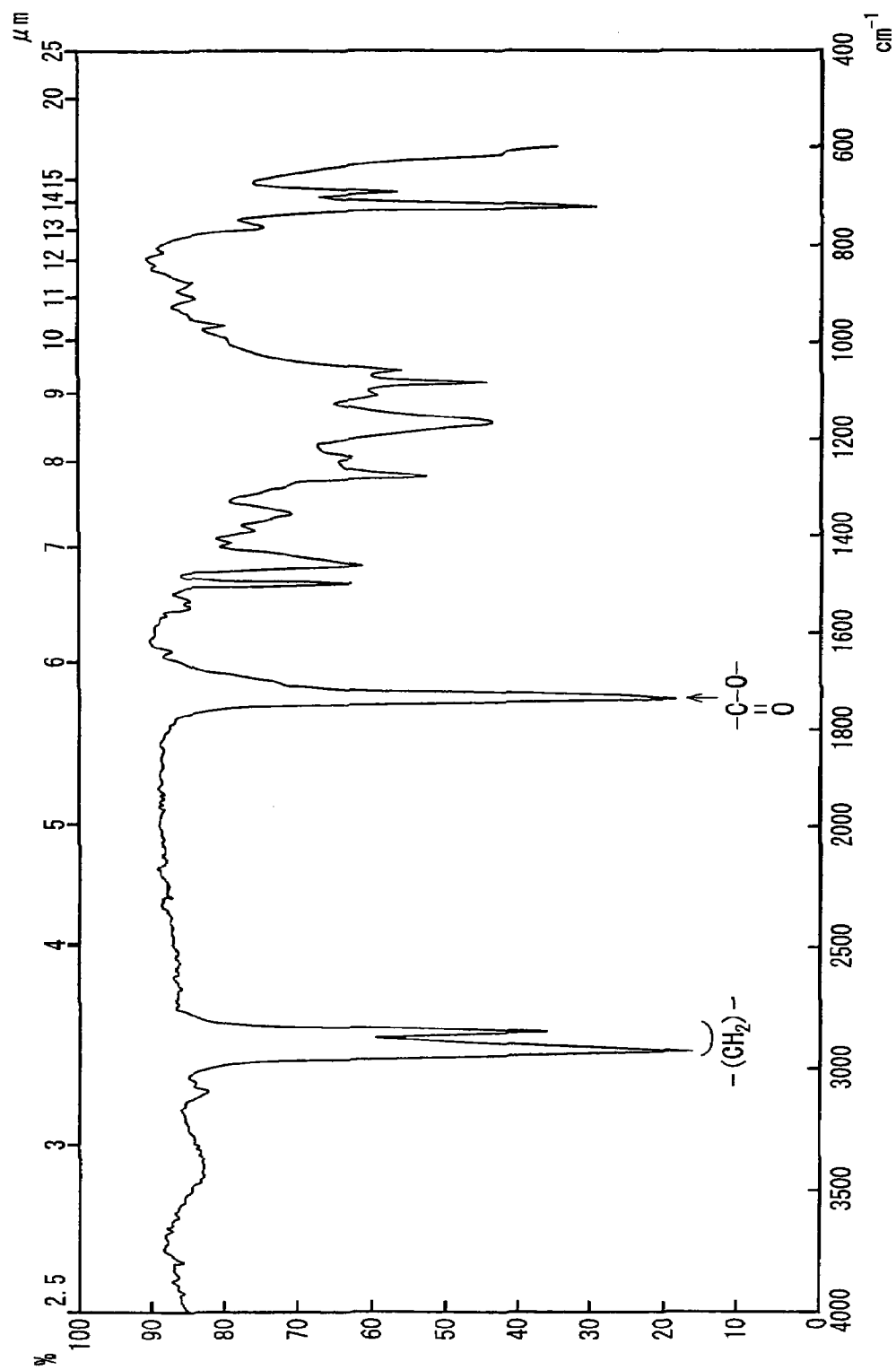
FIG. 3 is an IR analysis chart of the pyrrole compound in the example of the present invention.

Regarding PEN obtained, a chart showing a result of the nuclear magnetic resonance (NMR) analysis and a chart showing a result of the infrared (IR) absorption spectrum analysis are shown in FIGS. 2 and 3, respectively.

NMR
(1) Measuring device: AL300 (device name, manufactured by JEOL, Ltd.)
(2) Measuring condition: $^1$H-NMR (300 MHz), measuring 30 mg of a sample in a state of being dissolved in $CDCl_3$ Infrared Absorption Spectrum: IR
(1) Measuring device: 270-30 (device name, manufactured by Hitachi, Ltd.)
(2) Measuring condition: neat (measuring a sample interposed between two NaCl plates)

Example 1

Figure 4:
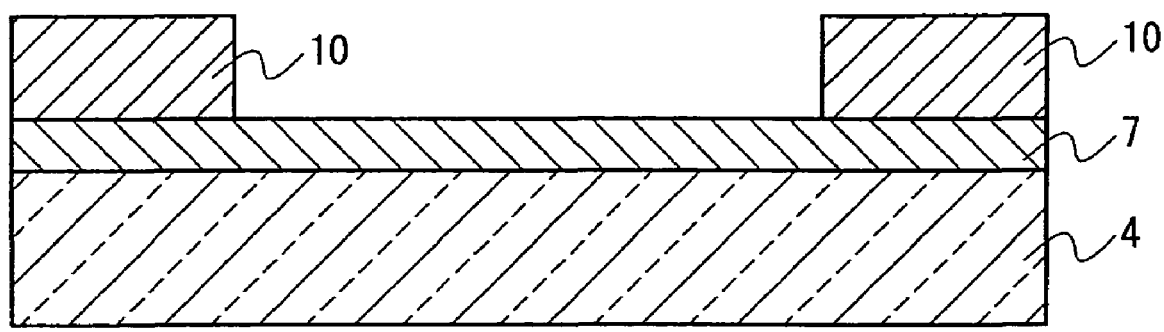
FIG. 4 is a cross-sectional view of a conductive thin film in an example of the present invention.

First of all, electric characteristics were measured using a basic element as shown in FIG. 4, to analyze a mechanism of recording.

PEN obtained in the above-described synthesis example was dissolved in polydimethyl siloxane (silicone oil) as a nonaqueous solvent at a concentration of 1%, whereby a coating solution was obtained. When the coating solution was applied over a glass substrate 4, dehydrochlorination occurred at room temperature (25° C.) between hydroxyl groups (—OH) on a surface of the glass and chlorosilyl groups (—$SiCl_3$) of PEN, whereby PEN was bound with the surface of the glass by covalent bonds. Platinum electrodes 10 were provided by vapor deposition partially on a surface of an organic film thus obtained. When the organic film was polymerized electrolytically, any one of the platinum electrodes 10 was used as a working electrode. As a supporting electrolyte, for instance, an acetonitrile solution of anhydrous lithium perchlorate (alternatively, tetraethylammonium tetrafluoroborate, or tetrabutylammonium perchlorate) at a concentration of 0.05 mol/L was prepared, and the substrate was immersed in the foregoing acetonitrile solution, while a gold electrode used as a counter electrode and a NaCl-calomel electrode as a reference electrode were immersed therein also in the same manner. An electrolytic polymerization reaction was caused in an inert gas atmosphere (for instance, in helium gas), under the conditions of a current density of up to 150 μA/cm$^2$ and a scanning rate of 100 mV/sec., at room temperature (25° C.), whereby a polypyrrole derivative ultra-thin film 7 was formed on a surface of the substrate. The formation of polypyrrole was confirmed by a Fourier transform infrared absorption spectroscopy analyzer.

To determine the electric properties of the foregoing organic film, operations of recording, reading, and reproduction were conducted using a scanning tunneling microscope (STM) and a conductive stylus of an atomic force microscope (AFM). First of all, FIG. 5A is a current image obtained by determination using the AFM before recording. A platinum electrode 10 is shown in a left half of the image. In the case of an organic film 7 that was not subjected to electrolytic polymerization, no flow of current was detected when a stylus was placed at an appropriate position and a voltage of 0.5 V was applied across the stylus and the platinum (electrode), and this shows that the organic film 7 was in a non-conductive state (a state of a first conductivity). Thereafter, again, a sample was scanned so that the writing was carried out, with a voltage of 10 V being applied across a stylus 100 and the platinum electrode 10, and by applying a voltage of 0.5 V across the stylus 100 and the platinum electrode 10 over an area including the portion to which the voltage of 10 V was applied, a current image as shown in FIG. 5B was obtained. A difference of FIG. 5B from the FIG. 5A is that the flow of current was detected in a region of the organic film 5 in which the writing was carried out (region scanned with a voltage of 10 V being applied across the stylus and the platinum). In the region with a changed color in a left half of FIG. 5B, a state of a second conductivity was detected. A current value was 100 nA. It is considered that polymerization occurred due to the application of a voltage of 10 V, thereby causing a transition from the non-conductive state to the conductive state. Finally, after a voltage of −10 V was applied across the stylus 100 and the organic film 7, a current image was taken by applying a voltage of 0.5 V again. An image thus obtained is shown in FIG. 5C. Here, an image showing no flow of current, as at the initial stage, was obtained (the state of the first conductivity).

The organic film was confirmed to be a material that exhibited a memory effect (electric memory effect) having a first conductivity as an OFF state and a second conductivity as an ON state. It was found that, assuming that a bit size of recording is 10 nm, the use of this mechanism ensures even a large capacity recording/reproduction of $10^{12}$ bit/cm$^2$. It should be noted that, in both the cases where this organic thin film was a monomolecular film and where it was a build-up film obtained by laminating monomolecular films, the same effect was obtained.

Further, the stable ON state (with a conductivity of 1 S/cm or more) and OFF state (with a conductivity of $1 \times 10^{-3}$ S/cm or less) as shown in FIG. 1 was obtained, the switching from the ON state to the OFF state exhibited a constant threshold voltage of +5 V to +10 V, the switching from the OFF state to the ON state mainly occurred with a voltage of about −5 V to −10 V, and a switching speed was such that an ON/OFF ratio (a ratio of a conductivity in the ON state to that in the OFF state) was $10^{17}$ to $10^2$ at 1 μsec or less. The threshold voltage of the switching exhibited a tendency to increase as the film thickness increased. In the case where an information processing device for performing recording, reproduction, and the like of information by rotating a flat-plate recording medium is prepared by applying the principles of the scanning probe microscope, a relative speed of the probe to the recording medium is made constant, whereby the occurrence of resonance upon high-speed scanning and the decrease of a S/N ratio of reproduction signals can be avoided. Therefore, the foregoing device is allowed to become a highly reliable device that has a large capacity and is capable of high-speed response.

Example 2

Figure 6A:
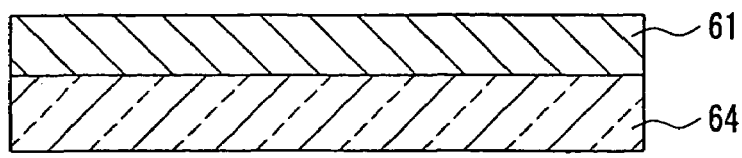
FIGS. 6A to 6F are cross-sectional views illustrating a manufacture process in Example 2 of the present invention.

In this example, first of all, as shown in FIG. 6A, horizontal selection lines 61 made of a conductive material were formed in a matrix on a glass substrate 64 by coating or the like. In the case where these lines were, for instance, of the p type, the lines were formed by mixing a p-type impurity during vapor deposition or by accelerated injection of a p-type impurity by injecting, ion doping, etc. after vapor deposition. Examples of the p-type impurity include B, Al, Ga, In, and TL.

Figure 6B:
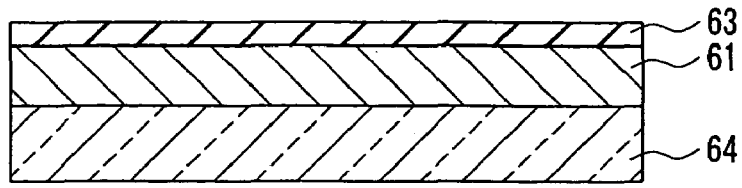
Figure 6C:
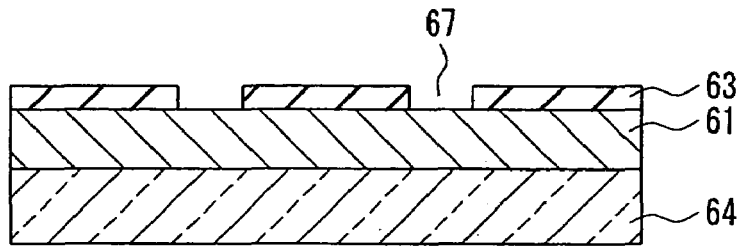
Figure 6D:
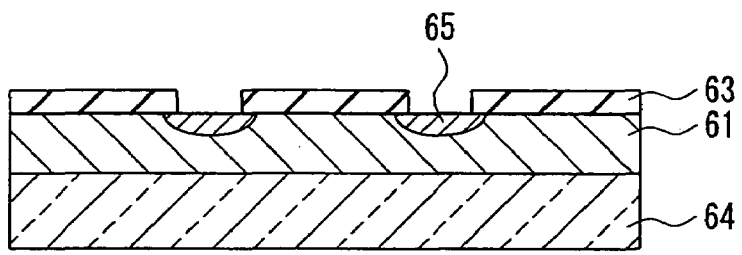
Figure 6E:
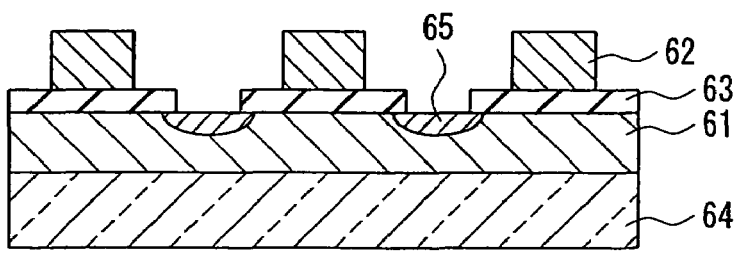

Next, a film of an electric insulation material 63 made of $SiO_2$ (film thickness: 300 nm) was formed by deposition or coating (FIG. 6B). Thereafter, as shown in FIG. 6C, contact holes 67 were formed in the electric insulation material 63 as shown in FIG. 6C, and an n-type ion was injected so that n-type regions 65 were formed as shown in FIG. 6D. Examples of the n-type impurity include N, P, As, Sb, and Bi. It should be noted that in the present example, a rectifier element was formed by a pn junction, but it may be formed by Schottky barrier. Next, vertical selection lines 62 were formed by coating or the like so that the insulation film 63 prevents the vertical selection lines 62 from being connected electrically with the horizontal selection lines 61 (FIG. 6E). Here, the horizontal selection lines 61 and the vertical selection lines 62 desirably are formed so as to cross each other orthogonally.

Figure 6F:
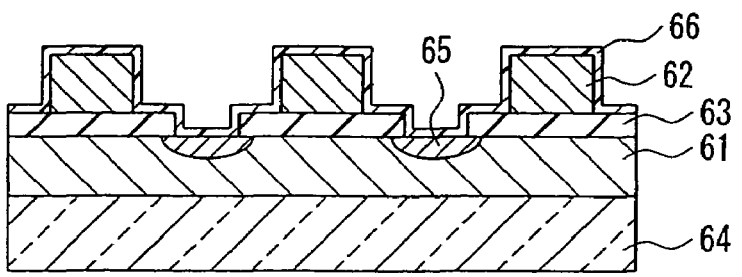

Finally, a conductive monomolecular organic film 66 was formed on the substrate with the lines provided in matrix thereon, in the same manner as that in Example 1, as shown in FIG. 6F. Here, as described above, the horizontal selection lines 61 and the vertical selection lines 62 are connected with each other via the organic film 66.

As described above, the organic film (monomolecular film) 66 was formed so as to cover, from above, an entirety of the horizontal selection lines 61 on a lower side, the insulation film 63, and the vertical selection lines 62 on an upper side, which were formed in matrix form.

Figure 7:
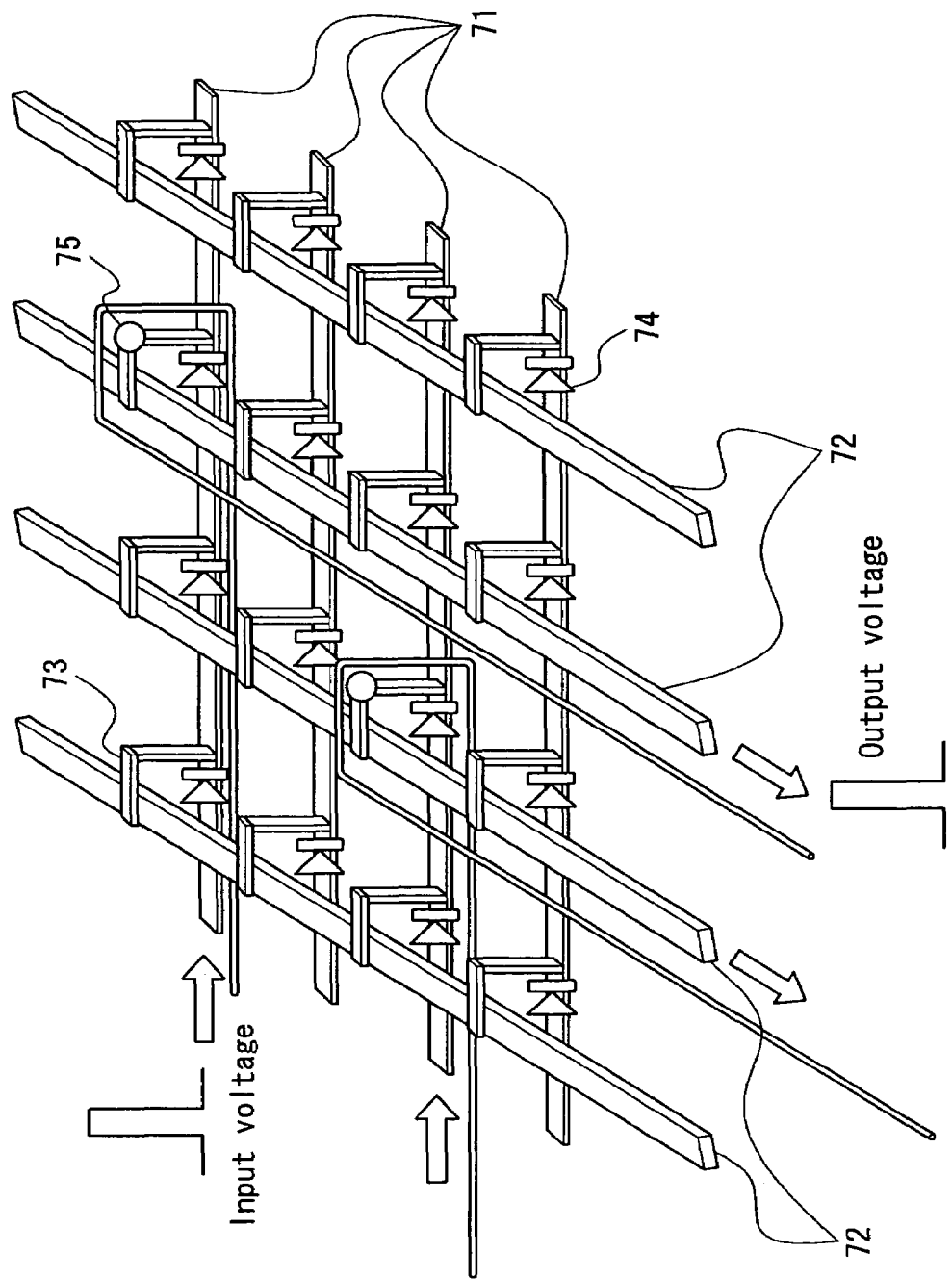
FIG. 7 is a perspective view illustrating a nonvolatile memory in an example of the present invention.

An organic film (monomolecular film) element thus having a cross-sectional structure formed as described above is shown in FIG. 7 as an example. With the layout in the matrix form as shown in FIG. 7, a multiplicity of layer structures, each of which is composed of the horizontal selection line 71, the vertical selection line 72, and the conductive organic film 73, are formed two-dimensionally, and each memory cell (element employing an organic film) stores one bit. 74 denotes a diode, and 75 denotes an ON state.

The recording and reading with respect to each organic film (monomolecular film) element are carried out according to the following principle.

The recording is carried out as follows. Assume that a voltage (or a set current) necessary for making each organic film (monomolecular film) element conductive is X. First, when a voltage (in the forward direction of the rectifier element) of X is applied to each of a horizontal selection line 71 and a vertical selection line 72 in a direction such that the same conductivity occurs in an organic film (monomolecular film) element in a non-conductive (first conductivity) state (in the forward direction of the pn element), only the organic film (monomolecular film) element present at a crossing point of the horizontal selection line 71 and the vertical selection line 72 through which current flows is caused to become conductive (second conductivity, the conductivity being not less than 1 S/cm). More specifically, by applying a predetermined voltage, the conductivity varies from the first conductivity to the second conductivity. A non-conductive state (first conductivity, the conductivity being not more than $10^{-3}$ S/cm) is achieved by changing the polarity of the voltage flowing through the horizontal selection line and the polarity of the voltage flowing through the vertical selection line. The state varies from the second conductive state to the first conductive state, and a ratio of the first conductivity to the second conductivity is about $10^{17}$ to $10^2$. Here, the voltage for achieving the non-conductive state (first conductivity) is −X in the present material system, which is an inverse voltage to the voltage X for varying the conductivity from the first conductivity to the second conductivity, but in another material system, it may be different from −X in some cases. The conductivity/non-conductivity of the organic film (monomolecular film) element are caused to correspond to 0 and 1, with which one bit of digital signals can be recorded.

When a signal recorded is read out, as in the recording, the horizontal selection lines 71 and the vertical selection lines 72 are used for applying a voltage (or a current) smaller than X to an organic film (monomolecular film) element to be read. In the case where the organic film (monomolecular film) element as a target of the reading operation herein is in the conductive state (second conductivity), a current flows through the organic film (monomolecular film) element, and is outputted to the vertical selection line 72. In the case where the organic film is in a non-conductive state (first conductivity), less current flows through the vertical selection line 72, and nothing is outputted. The vertical selection line detects a current and outputs it as readout data. It should be noted that when the reading operation is carried out with respect to the element, recorded contents therein are not damaged, and there is no need to record the same again therein. Therefore, it can be used as a nonvolatile memory.

It should be noted that Example 2 is described by referring to a case in which lower lines and upper lines are formed, but the present invention is not limited to this case. The same function as that described above can be achieved by a configuration composed of vertical selection lines 2 and horizontal selection lines made of an electric conductor that are arranged on organic films (monomolecular films) arrayed in a matrix on a substrate with an electric insulator being interposed therebetween.

Application Example 1

Figure 8:
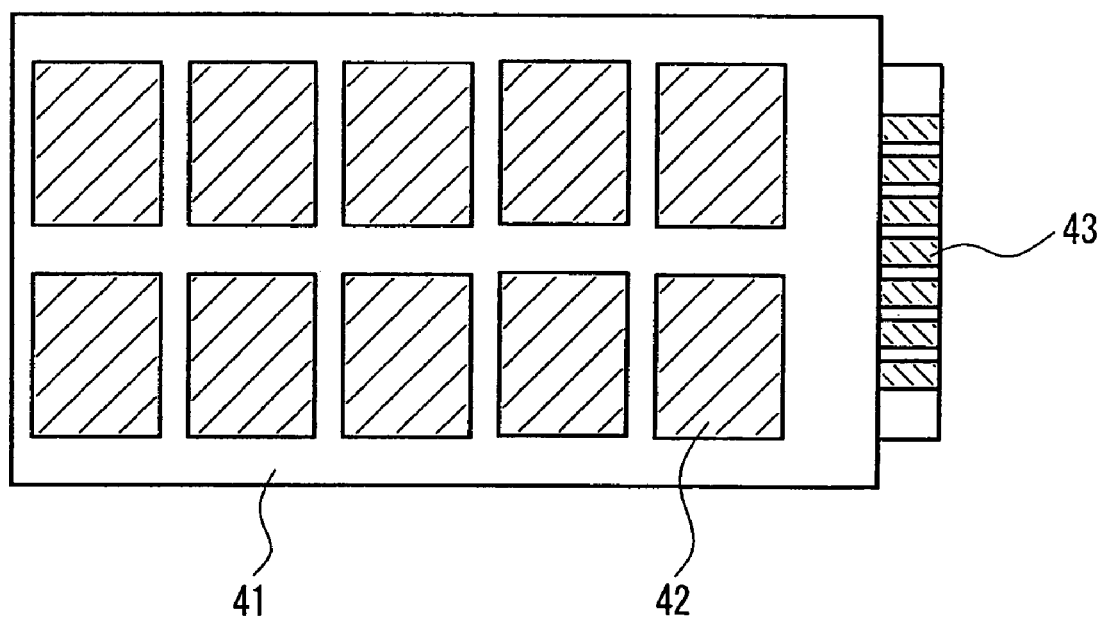
FIG. 8 is a plan view of a semiconductor disk substrate in an application example of the present invention.

FIG. 8 illustrates an example in which the memory elements 42 of Example 2 described above are used in a semiconductor disk substrate 41. 43 denotes a connector part. Thus, by using the memory elements 42 in the semiconductor disk substrate 41, a significantly advantageous solid-state storage medium that is inexpensive and has a large capacity can be obtained. Further, the foregoing medium enables the downsizing of a system as a whole since it does not require a mechanical driving system unlike a conventional diskette or hard disk, and further, it has a high resistance against shock. Therefore, the medium is suitable as an external storage for compact and portable computer systems. Therefore, it can compose a DRAM with a high degree of integration and a large capacity.

Application Example 2

Figure 9:
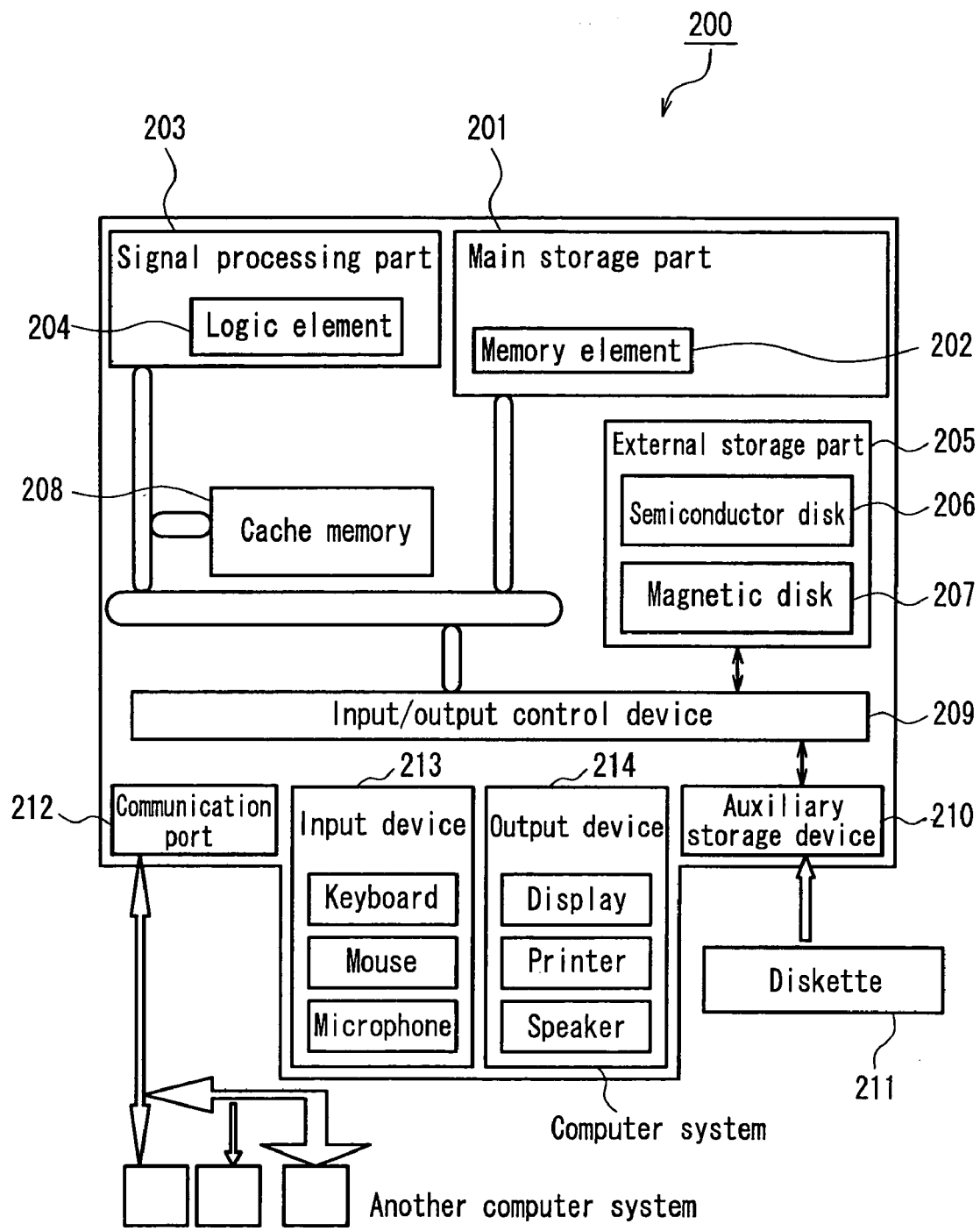
FIG. 9 is a conceptual view of a computer system in the application example of the present invention.

FIG. 9 is a diagram illustrating a configuration of a computer system 200 employing a logic element (microprocessor), a memory element (DRAM), and a semiconductor disk substrate of Examples described above. The computer system 200 is composed of a signal processing part 203, a cache memory 208, a main storage part 201, an external storage part 205, an input device 213, an output device 214, an input/output control device 209, an auxiliary storage device 210 connected with a diskette 211, a communication port 212 connected with another computer system, etc. A logic element 204 of Examples described above can be used as the signal processing part 203. Further, the element of the foregoing examples can be sued as the memory element (DRAM) 202 of the main storage part 201. Further, it can be applied to the semiconductor disk substrate 206 and magnetic disk 207 of the external storage part 205.

With this configuration, a system as a whole can be downsized, and a large amount of information can be read/written at high speed, whereby the processing capability of the system as a whole is enhanced.

A DRAM cell of the present example can be used, like a conventional DRAM cell, in electronic devices such as a semiconductor memory card, a semiconductor disk device, a SOI integrated circuit, a microprocessor, and a computer. Particularly, since the DRAM cell of the present example has a small size but a large capacity, it ensures the downsizing of a system as a whole and improves the processing capability.

Example 3

Figure 10A:
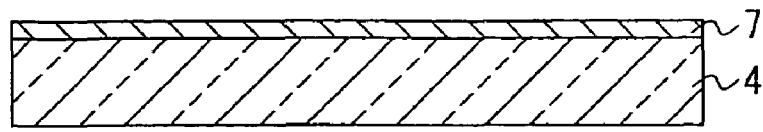
FIGS. 10A to 10F are cross-sectional views illustrating a manufacturing process in Example 3 of the present invention.

In the present example, an organic film (monomolecular film) 7 was formed over a substantial entirety of a glass or polyimide film substrate 4 as shown in FIG. 10A. A chemical compound expressed by a formula (17) shown below, for instance, was used as a material for the organic film. As a coating method for the same, any one of the methods may be used among vapor deposition, coating with use of a spin coater, a coating method by immersing the substrate in a solution, etc. Since active hydrogen such as a hydroxyl group is present on a surface of the glass or polyimide film substrate 4, dehydrochlorination or dealcoholization occurred between the foregoing hydrogen and the halogenated silyl group or alkoxysilyl group of the chemical compound, and residues of the chemical compound were bound by covalent bonds with the surface of the substrate. Thereafter, washing with a non-aqueous solution was carried out, and a monomolecular film is obtained.

For instance, 11-(1-pyrrolyl)-undecenyltrichlorosilane expressed by the chemical formula (17) shown below was diluted to 1 percent by mass with dehydrated dimethylsilicone solution, so that a chemisorption liquid was prepared.

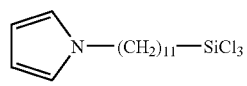

(17)

A glass substrate with a thickness of 5 mm was immersed in the foregoing chemisorption liquid so that chemisorption molecules were adsorbed onto surfaces of the substrate. Thereafter, the glass substrate was immersed in a chloroform solution so that non-reacted film material molecules remaining thereon were washed and removed. Thus, the monomolecular organic film 7 expressed by a chemical formula (18) without contaminant on its surface was formed. It should be noted that the chemical formula (18) indicates a case in which all the —SiCl binding groups in the chemisorption molecule react with the surface of the substrate, but at least one of the —SiCl binding groups may react with the surface of the substrate.

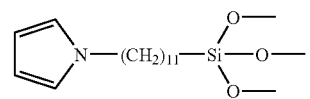

(18)

Next, a surface of the monomolecular organic film 7 thus formed was subjected to a rubbing process using a rubbing device normally used for preparing a liquid crystal alignment film, so that the chemisorption molecules composing the monomolecular organic film were aligned. In the rubbing process, a 7.0 cm-diameter rubbing roll around which a rubbing cloth made of rayon was wrapped was used, and a rubbing operation was carried out under conditions of a pressing depth of 0.3 mm, a nip width of 11.7 mm, the number of revolutions of 1200 per second, and a table speed (substrate running speed) of 40 mm/second. Here, a film aligned (tilted) substantially in parallel with the rubbing direction was obtained.

Next, vapor deposition, photolithography, and etching were carried out so that a pair of 50 mm-long platinum electrodes were formed with a gap of 5 mm therebetween on the surface of the monomolecular film by vapor deposition, and thereafter, electrolytic oxidation polymerization was carried out by immersing the substrate in ultrapure water at room temperature while a voltage of 8 V was applied across the pair of platinum electrodes for 6 hours. Thus, a conductive region having a conductive network that included a conductive polypyrrole type conjugated system ranging in a predetermined direction (rubbing direction), which had as a polymerization unit the structure expressed by a chemical formula (19) shown below, was formed between the platinum electrodes.

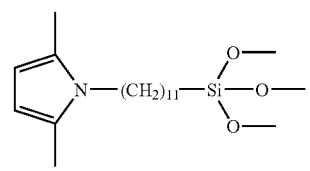

(19)

The organic conductive film obtained had a thickness of approximately 2.0 nm, and a thickness of a polypyrrole portion thereof was approximately 0.2 nm.

A current of 1 mA was caused to flow by application of a voltage of 8 V across the foregoing platinum electrodes via the foregoing organic conductive film. Therefore, a monomolecular film having a conductive region with a conductive network having a conductivity of approximately $10^3$ S/cm was obtained, without doping an impurity such as a donor or an acceptor.

Before the foregoing electrolytic polymerization, platinum was deposited on a portion of the foregoing thin film by vapor deposition (so as to have a film thickness of 1 μm), so that it functions as a working electrode. For instance, an acetonitrile solution of anhydrous lithium perchlorate (alternatively, tetraethylammonium tetrafluoroborate, or tetrabutylammonium perchlorate) at a concentration of 0.05 mol/L was prepared as an electrolytic solution, and the foregoing thin film substrate 4 was immersed in the acetonitrile solution, while gold electrodes as paired electrodes and NaCl-calomel electrodes as reference electrodes were also immersed therein. Polymerization was carried out under conditions of an inert ambient gas (for instance, helium gas), a current density of approximately 150 μA/cm², and a scanning speed of 100 mV per second, so that a polypyrrole derivative thin film 7 was formed on the surface of the substrate. The formation of the polypyrrole derivative thin film was confirmed by Fourier transform infrared spectroscopy.

Figure 10B:
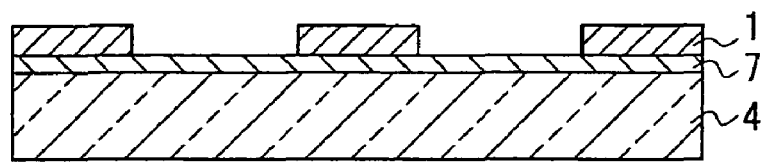

Next, when lines in matrix form were prepared, only those in an X direction were prepared first, for convenience (FIG. 10B). These lines are referred to as vertical selection lines 1. The vertical selection lines 1 were formed by forming Si by vapor deposition, plating or the like, so that the lines had a thickness of 0.5 μm. Since the lines desirably were n type, an n-type impurity (for instance, phosphor (P), arsenic (As), or antimony (Sb)) may be mixed during vapor deposition, or alternatively, an n-type impurity may be injected after vapor deposition, or subjected to accelerated injection by ion doping, etc.

Figure 10C:
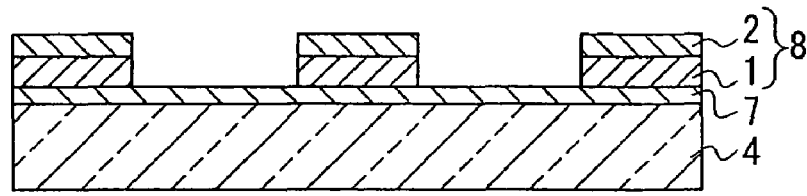

Then, lines 2 with substantially the same thickness were formed on the vertical selection lines 1 so as to be arrayed in the same pattern (FIG. 10C). An impurity (for instance, boron (B), aluminum (Al), gallium (Ga), or indium (In)) was mixed therein by the same method as that described above so that they had a characteristic of p type, in contrast to the foregoing n type. For convenience of description, the n-type and p-type lines are referred to as vertical selection lines 8.

Since the vertical selection lines 8 had pn junction in the vertical direction, current flowed only in one direction. In other words, herein the lines were formed so that the configuration of a pn junction was prepared, but the junction may be Schottky barrier.

Figure 10D:
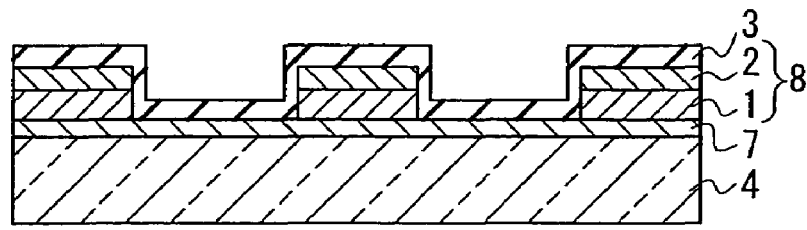
Figure 10E:
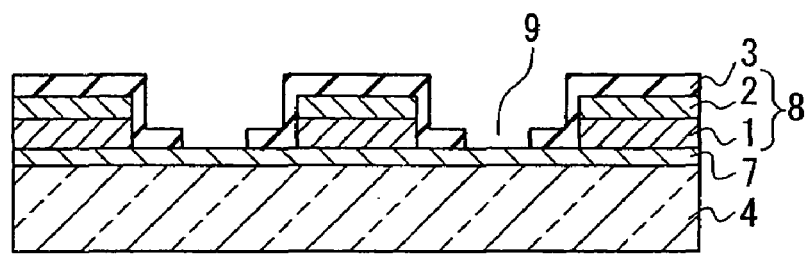

Thereafter, an insulation material film 3 (film thickness: 300 nm) such as $SiO_2$ was formed by deposition or coating (FIG. 10D). Then, contact holes 9 with a diameter of 2 μm each were formed so that the organic films were exposed (FIG. 10E). Here, an insulation material 3 such as $SiO_2$ may be deposited by vapor deposition using a metal mask so that the organic films are exposed. Or alternatively, photolithography may be carried out preliminarily, and an insulation film may be formed by the lift-off method or the like.

Figure 10F:
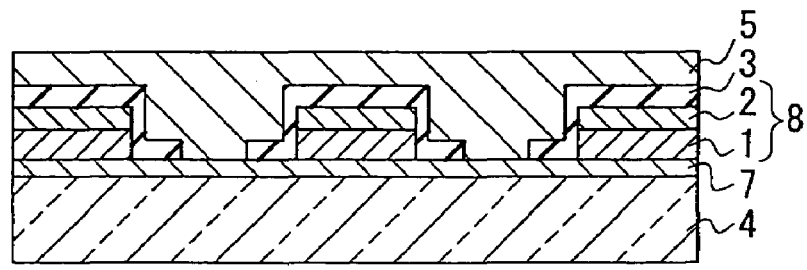

Then, platinum films 5 were formed by deposition or coating so as to have a thickness of 5 μm, as horizontal selection lines (FIG. 10F).

Figure 11A:
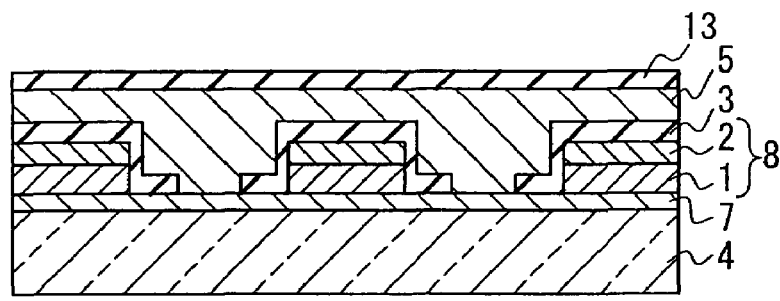
FIGS. 11A to 11D are cross-sectional views illustrating a manufacture process in Example 3 of the present invention.

Next, an insulation material film 13 of $SiO_2$ (film thickness: 300 nm) was formed by deposition or coating (FIG. 11A).

Figure 11B:
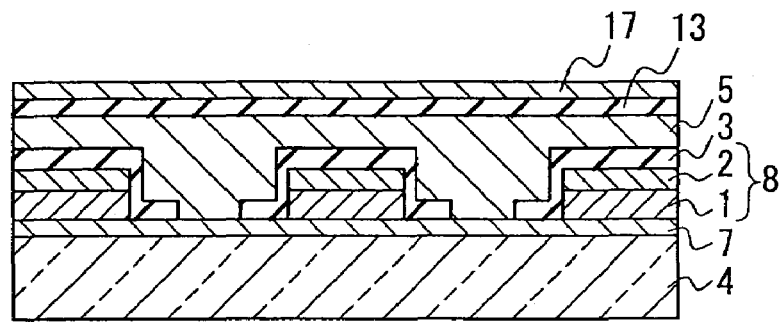

Then, an organic film 17 composed of a polypyrrole derivative film was formed in the same manner as that described above (FIG. 11B).

Figure 11C:
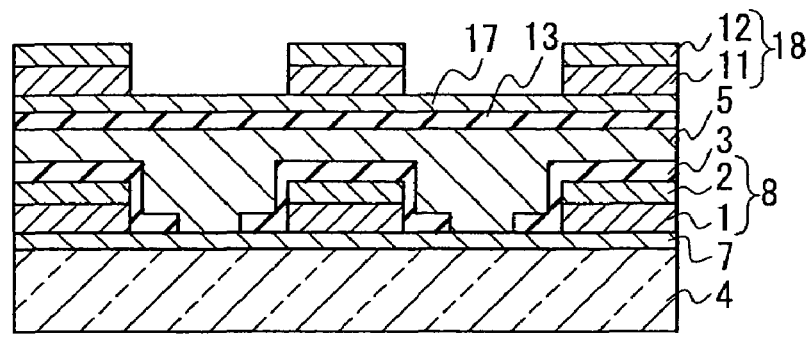
Figure 11D:
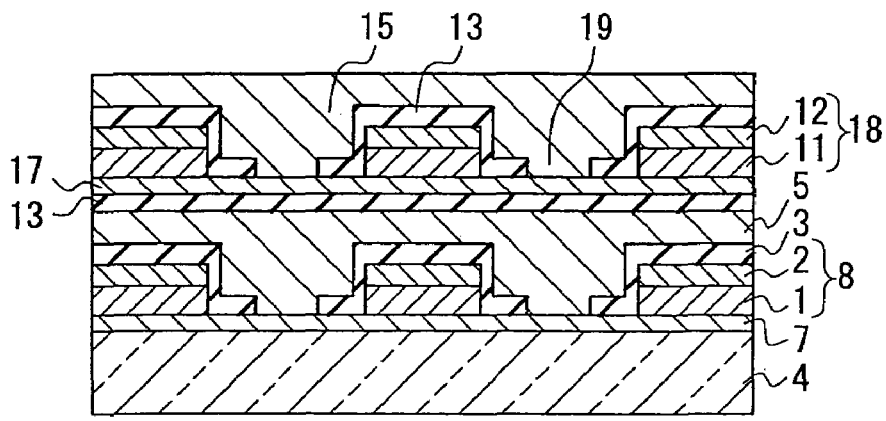

Next, in the same manner as that shown in FIGS. 10B to 10F, vertical selection lines 11 were formed, and lines 12 also were formed on the vertical selection lines 11 in the same pattern so as to have the same thickness (FIG. 11C), which are referred to as vertical selection lines 18. Since the vertical selection lines 8 had pn junction in the vertical direction, current flowed only in one direction. In other words, herein the lines were formed so that the configuration of a pn junction was prepared, but the junction may be Schottky barrier.

Thereafter, an insulation material film 13 (film thickness: 300 nm) such as $SiO_2$ was formed by deposition or coating, contact holes (via holes) 19 with a diameter of 2 μm each were formed so that the organic films were exposed, and horizontal selection lines 15 were formed by deposition or coating (FIG. 10D).

Thus, by successively forming the horizontal selection lines, and then, the insulation film, and thereafter forming the vertical selection lines, a memory cell or a nonvolatile memory with a three-dimensional structure can be prepared, and their capacity can be increased easily.

An example of an organic film (monomolecular film) nonvolatile storage element having the cross-sectional structure formed as described above is shown in FIG. 7. With the layout in the matrix form as shown in FIG. 7, a multiplicity of layer structures, each of which is composed of the horizontal selection line, the vertical selection line, and the insulation material, are formed three-dimensionally, and the organic film (monomolecular film) in each structure (memory cell) stores one bit. The storage and read out with respect to each organic film (monomolecular film) are carried out according to the following principles.

First, the recording method is described. An initial state of the organic film is referred to a first electric state exhibiting a first resistance. By applying a voltage of not lower than –X (for instance, –10 V) as a first threshold voltage shown in FIG. 1, which is necessary for making each organic film (monomolecular film) conductive, to each organic film (monomolecular film) storage element, the organic film makes a transition to a second electric state exhibiting a second resistance. Thus, by making a transition to an organic film having a lower resistance as compared with the initial stage, the organic film becomes conductive. In other words, by applying voltage satisfying X to one of the vertical selection lines and one of the horizontal selection lines, an organic film present at a crossing point of the selection lines through which current flows becomes conductive, and the recording is completed. The conductive state (the second electric state exhibiting the second resistance) has no change in its characteristics unless a second threshold voltage (for instance, not less than 10 V) that causes from the second electric state to the first electric state is applied thereto. As to the reading, current flows through a portion (organic film) subjected to recording, thereby reaching output and being read out. Even if current flows through a portion not having been subjected to recording, nothing is outputted to the vertical selection line 2. By applying the second threshold voltage contrarily, an organic film becomes non-conductive, thereby preventing data to be outputted therefrom from being outputted, which enables erasure of the data.

To observe the foregoing phenomenon, operations of recording, reading, and reproduction were experimented using a scanning tunneling microscope (STM) and a conductive stylus of an atomic force microscope (AFM), in the same manner as that in Example 1. Consequently, the results shown in FIGS. 5A to 5C were obtained as in Example 1.

Thus, the stable ON state (with a resistance of 10 Ω) and OFF state (with a resistance of not less than M Ω) was obtained, the switching from the ON state to the OFF state exhibited a constant threshold voltage of +5 V to +10 V, the switching from the OFF state to the ON state mainly occurred with a voltage of –5 V to –10 V, and a switching speed was such that an ON/OFF ratio (a ratio of a conductivity in the ON state to that in the OFF state) was in a not less than five-digit order at 1 μsec or less. The threshold voltage of the switching exhibited a tendency to increase as the film thickness increased. In the case where an information processing device for performing recording, reproduction, and the like of information by rotating a flat-plate recording medium is prepared by applying the principles of the scanning probe microscope, a relative speed of the probe to the recording medium is made constant, whereby the occurrence of resonance upon high-speed scanning and the decrease of a S/N ratio of reproduction signals can be avoided. Therefore, the foregoing device is allowed to become a highly reliable device that has a large capacity and is capable of high-speed response.

By changing the polarity of the voltage applied to each selection line, and applying the second threshold voltage for changing the state from the second electric state to the first electric state, the state of the organic film can be caused to make a transition from the conductive state to the non-conductive state. The conductivity and non-conductivity of the organic film (monomolecular film) are made to correspond to 0 and 1, whereby one bit of digital signals can be recorded.

The vertical selection lines detect current, which are readout data. It should be noted that when the reading operation is carried out with respect to the block element, recorded contents therein are not damaged, and there is no need to record the same therein again. Therefore, it can be used as a nonvolatile memory.

An experiment was carried out to determine to what degree the organic film is degraded, during $10^{15}$ cycles in one month, in which the recording, reproduction, erase, and reproduction in the stated order compose one cycle. As a result, no particular deterioration was observed. Further, signals were read out with sufficient S/N at all times during the experiment, and no degradation of characteristics was observed in repetitive recording and reproduction.

Example 4

Figure 12A:
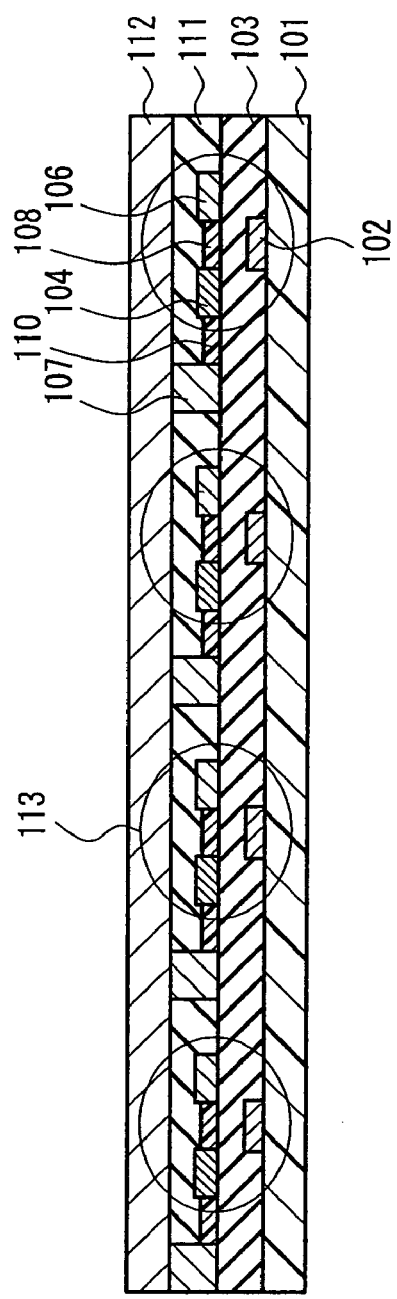
FIG. 12A is a cross-sectional view illustrating a nonvolatile memory element in Example 4 of the present invention.
Figure 12B:
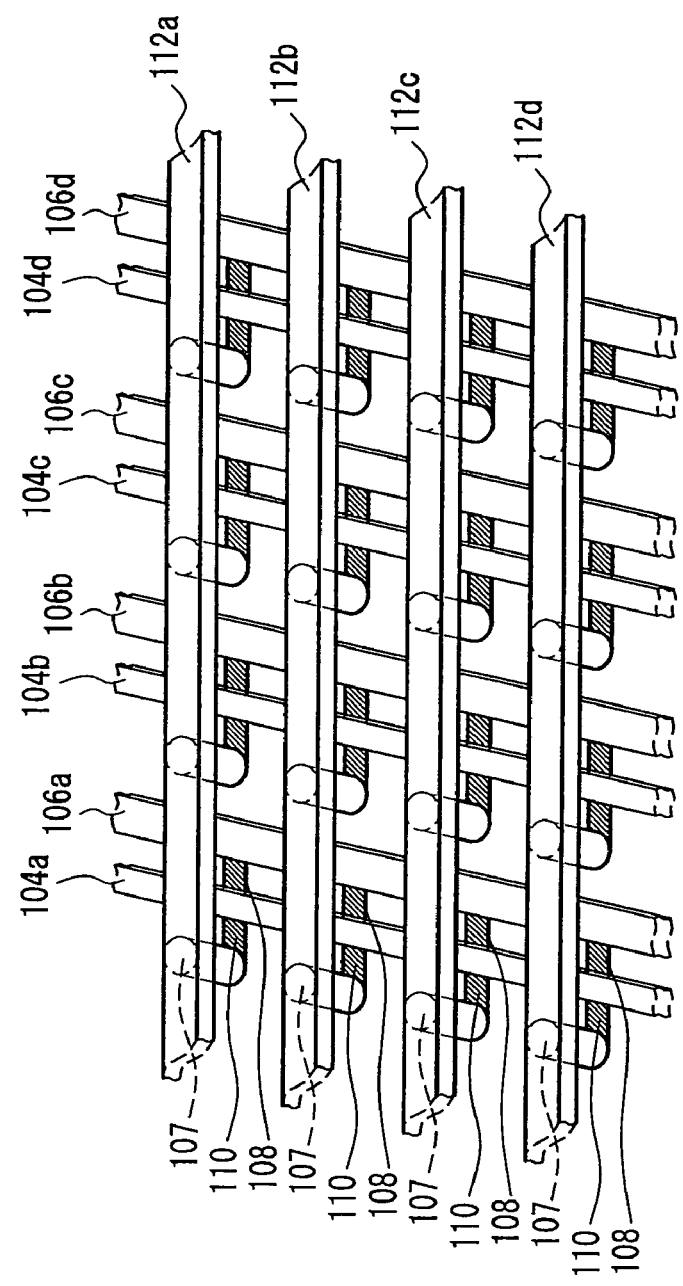
FIG. 12B is a partially enlarged perspective view of the same.

First, electric characteristics were measured using an element as shown in FIGS. 12A and 12B, to determine the mechanism of recording.

Platinum was deposited by vapor deposition so as to have a thickness of 0.5 µm, a width of 1 µm, and a length of 5 µm on a substrate 101 made of a polyimide film having a thickness of 1000 µm, and this was used as a gate electrode 102. Next, a silica film ($SiO_2$) was formed by vapor deposition so as to have a thickness of 1 µm. This was used as a gate oxide film 103.

Next, a source electrode 104 and a drain electrode 106 were formed with platinum by vapor deposition so that each of them had a thickness of 1 µm, a width of 1 µm, and a length of 5 mm, while at the same time platinum was deposited by vapor deposition so as to have a thickness of 2 µm, a width of 1 µm, and a length of 5 mm, as a contact part 107. A distance between the contact part 107 and the source electrode 104 was 30 µm, and a distance between the source electrode 104 and the drain electrode 106 was 5 µm. Finally, after an electric insulation film 111 was formed, a portion of the contact electrode 107 was subjected to dry etching so that holes were formed, and horizontal selection lines 112 were formed.

Figure 13:
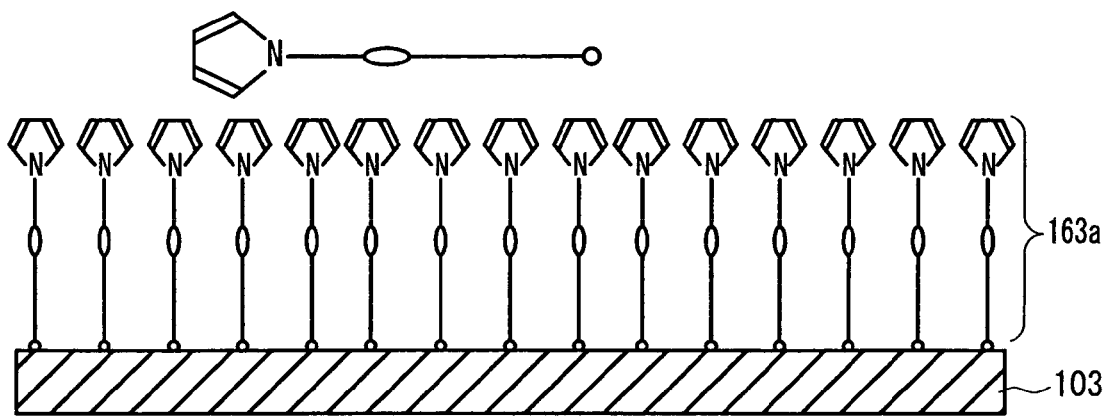
FIG. 13 is a view illustrating a chemical reaction state of a chemisorption molecule film in Example 4 of the present invention.

A chemisorption liquid was prepared using PEN of the foregoing synthesis example and diluting it with a dehydrated dimethyl silicone solvent to 1 wt %. The chemisorption liquid was coated on spaces between the contact part 107 and the source electrode 104, and between the source electrode 104 and the drain electrode 106, so that a chemisorption reaction was caused. Further, non-reacted portions of the foregoing substance, which remained on a surface thereof, were removed by washing with chloroform, whereby a monomolecular film was formed (FIG. 13). Since many hydroxyl groups containing active hydrogen are present in the gate oxide film 103 made of silica, dehydrochlorination of —$SiCl_3$ groups of the PEN with the hydroxyl groups occurred, and a monomolecular film 163a composed of molecules expressed by a chemical formula (20) below was formed, which was bound with the surface of the substrate by covalent bonds.

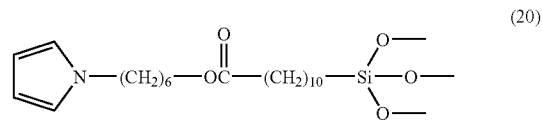
(20)

Method for Aligning the Molecular Film

Figure 14:
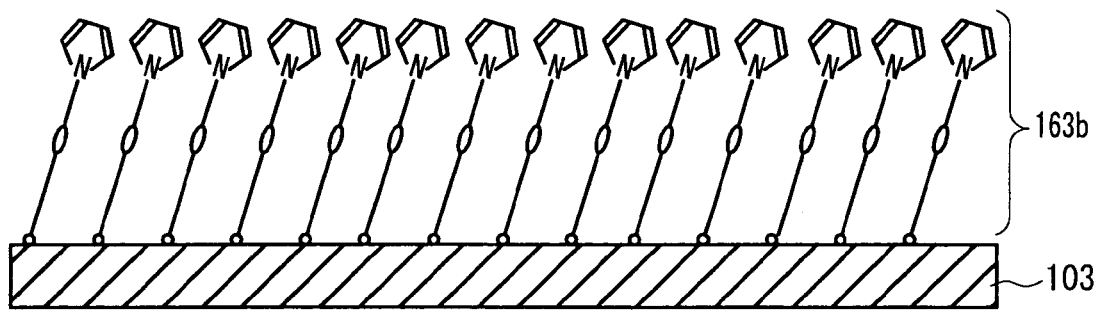
FIG. 14 is a view illustrating alignment of chemisorption molecule film of Example 4 of the present invention.
Figure 28A:
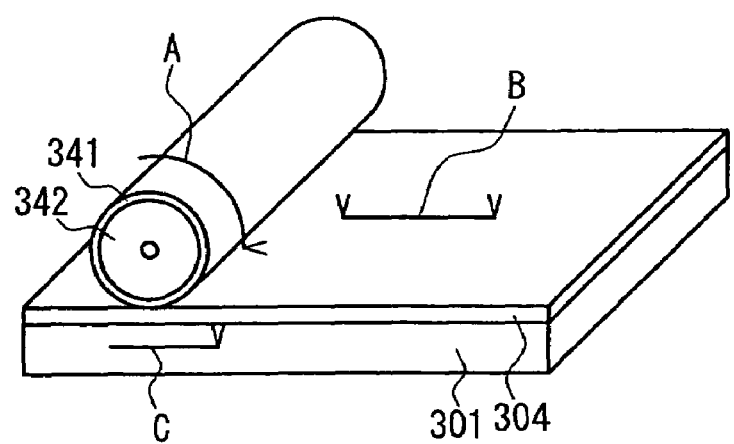
FIGS. 28A to 28C are perspective views illustrating a method for aligning molecules in an example of the present invention.

Next, the substrate with the monomolecular film 163a formed thereon was washed with a non-aqueous chloroform solution, and after drying the same, a rubbing alignment process as shown in FIG. 28A was carried out, whereby a monomolecular film 163b thus aligned, shown in FIG. 14, was formed.

Figure 28B:
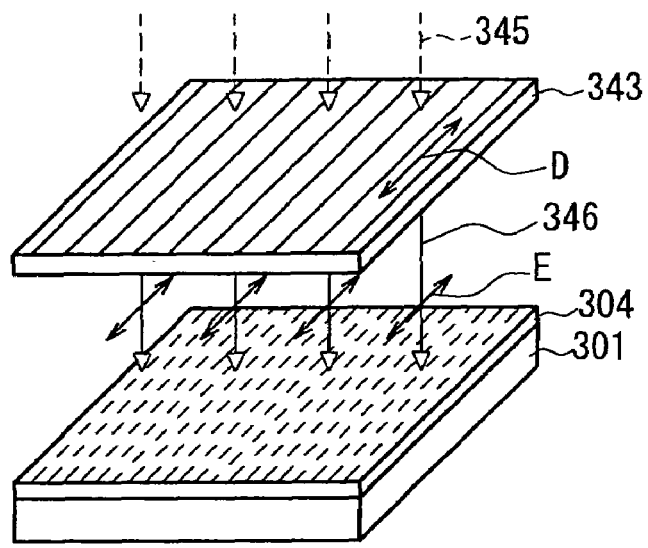
Figure 28C:
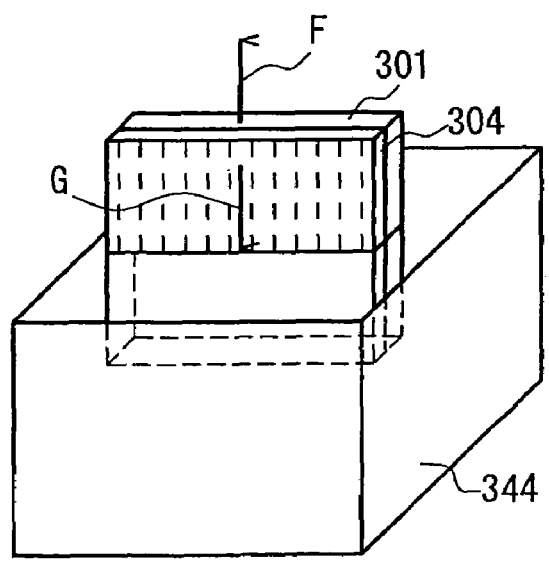

Here, the alignment process is described in detail. FIGS. 28A to 28C are schematic perspective views illustrating alignment methods for tilting (aligning) molecules composing an organic thin film. FIG. 28A illustrates a rubbing alignment process, FIG. 28B illustrates an optical alignment process, and FIG. 28C illustrates a draining alignment process.

The rubbing alignment process is a process for aligning organic molecules composing a monomolecular film 304 in a rubbing direction B by rubbing a surface of the monomolecular film 304 with a rubbing cloth 341, by rotating, in a rotation direction A, a rubbing roll 342 wrapped with the rubbing cloth 341 that is in contact with the monomolecular film 304, while transporting a substrate 301 with the monomolecular film 304 formed thereon in a predetermined direction (substrate transporting direction) C, as shown in FIG. 28A. By so doing, the monomolecular film 304 aligned in the rubbing direction B can be formed on the substrate 301.

The optical aligning process is a process of projecting either ultraviolet rays or visible rays 345 to a polarizing plate 343 having a transmission axis direction D, as shown in FIG. 28B, so as to align organic molecules composing a monomolecular film 304 in a polarization direction E with a polarized light 346. As the polarized light, linearly polarized light is preferable. By so doing, the monomolecular film 304 aligned in the polarization direction can be formed on the substrate 301.

The draining alignment process is a process of lifting up a substrate 301 in a lifting direction F, while tilting the same at a predetermined tilt angle with respect to a liquid level of an organic solvent 144 for washing as shown in FIG. 28C, so that the organic molecules composing the monomolecular film 304 are aligned in a direction G in which the solvent is drained. By so doing, the aligned monomolecular film 304 can be formed on the substrate 301.

Though not shown in the drawings, the alignment can be achieved by fluctuations of molecules in a solution during the catalytic polymerization or the electrolytic oxidation polymerization.

Polymerization Process

Figure 15:
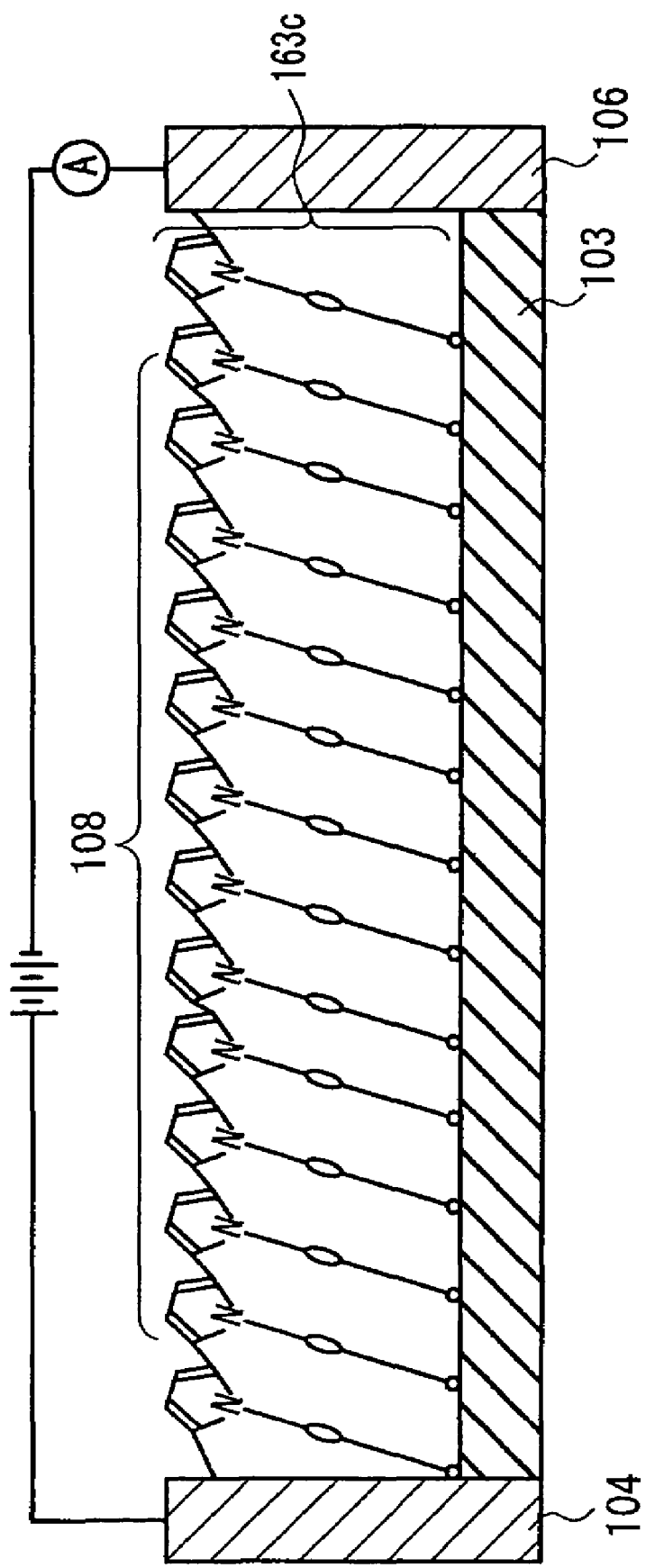
FIG. 15 is a view illustrating a conductive organic thin film formed after electrolytic polymerization in Example 4.

Next, electrolytic polymerization was carried out. The platinum electrodes 104 and 106, for instance, were used working electrodes (FIG. 15), and an acetonitrile solution of anhydrous lithium perchlorate (alternatively, tetraethylammonium tetrafluoroborate, or tetrabutylammonium perchlorate) at a concentration of 0.05 mol/L was prepared, for instance, as an electrolytic solution, and the substrate was immersed in the foregoing acetonitrile solution. An electrolytic polymerization reaction was caused in an inert gas atmosphere (for instance, in helium gas), at room temperature (25° C.), under the conditions of a current density of up to 150 µA/cm² and a scanning rate of 100 mV per second, whereby a polypyrrole derivative conductive thin film 108 was formed on a surface of the substrate (FIGS. 12A and 15). The formation of polypyrrole was confirmed with Fourier transform infrared absorption spectroscopy analyzer.

In electrolytic oxidation polymerization, conjugated bonds are self-organized in the direction of the electric field. Therefore, when the polymerization was completed, the completion can be confirmed by the first electrode 104 and the second electrode 106 being connected electrically with each other via the conductive polymer film 108. The organic conductive film 108 obtained had a thickness of approximately 2.0 nm, a thickness of a polypyrrole portion thereof was approximately 0.2 nm, and an organic conductive film 34C had a length of 1 µm and a width of 5 µm. Using the foregoing configuration, electrolytic oxidation polymerization was conducted, using the first electrode 104 (source electrode) as a positive electrode, and the second electrode 106 (drain electrode) as a ground (earth). The manner of application of the electric field relates to the "directivity" of a conductive memory to be formed later.

One unit of the organic conductive film polymer obtained is expressed by a chemical formula (21) shown below:

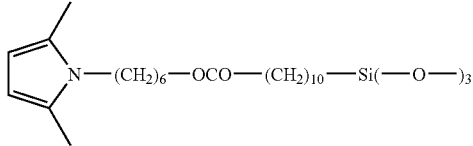

(21)

Next, as shown in FIG. 12A, a silica film (SiO$_2$) was formed by vapor deposition so as to have a thickness of 1 µm, as an electric insulation film 111. Next, platinum was deposited by vapor deposition so that each had a thickness of 0.5 µm, a width of 1 µm, and a length of 5 mm, as horizontal selection lines 112. A cross-sectional view of a device obtained is shown in FIG. 12A, and a principal part perspective view of a memory part thereof is shown in FIG. 12B. 113 in FIG. 12A denotes a transistor part as a principal part of a non-volatile memory, 104a to 104d in FIG. 12B denote source electrodes, 106a to 106d therein denote drain electrodes (vertical selection lines), 107 denotes each of contact electrodes connected with the horizontal selection lines 112a to 112d, and 108 and 110 denote conductive organic thin films.

Measurement

It was determined by an atomic force microscope (AFM) available in the market (SAP 3800N, manufactured by Seiko Instruments Inc.) in the AFM-CITS mode that the obtained conductive organic film 108 without doping had a conductivity ρ of more than 1×10$^7$ S/cm at room temperature (25° C.) under conditions of a voltage of 1 mV and an amperage of 160 nA. This was because the foregoing ammeter was only capable of determining up to 1×10$^7$ S/cm, and in the foregoing case, it was off-scale. Considering that gold and silver as metals having excellent conductivities have 5.2× 10$^5$ S/cm and 5.4×10$^5$ S/cm, respectively, at room temperature (25° C.), the conductivity ρ of the organic conductive film of the present example is surprisingly high. Therefore, the organic conductive film of the present invention can be regarded as "superconducting metal film".

In the present invention, it is easy to decrease the conductivity ρ of the organic conductive film, since this can be accomplished by providing the conductive network incompletely, or by decreasing the alignment degree of molecules.

Figure 16:
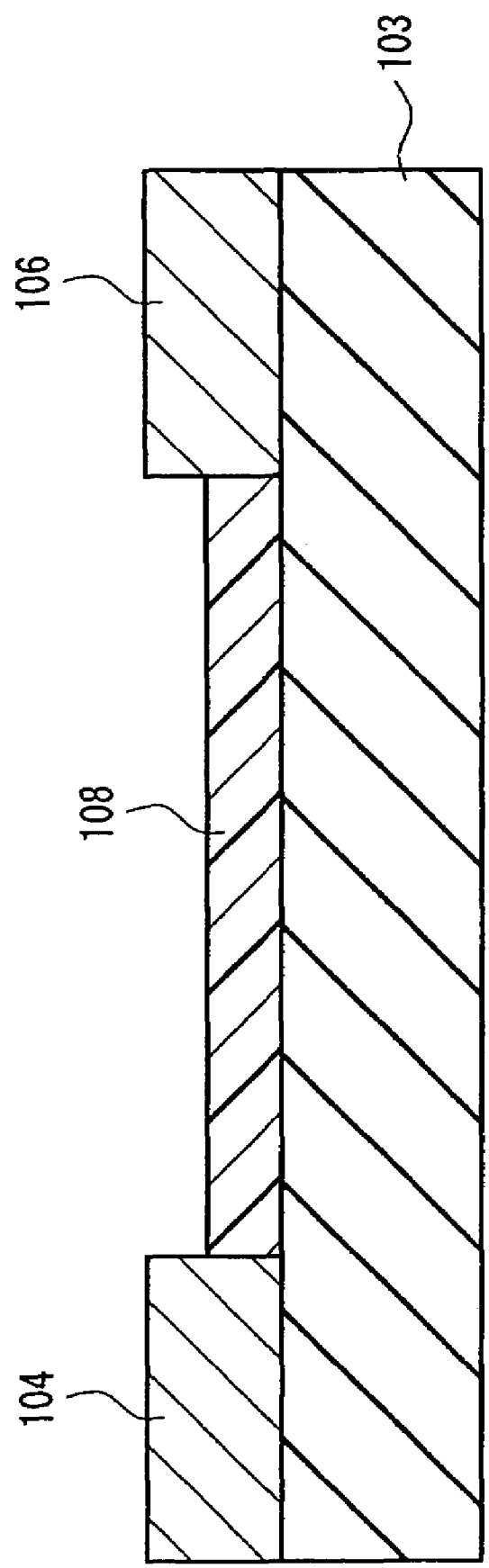
FIG. 16 is a partially expanded view of a nonvolatile memory part in Example 4 of the present invention.

FIG. 16 is an enlarged view of a part of the conductive organic thin film 108 between the source electrode 104 and the drain electrode 106 in FIGS. 12A and 12B.

By such a method, the readout of the recorded information, and the reproduction of the same were conducted using the organic thin film sample having metal electrodes as shown in FIGS. 12A and 12B, and a conductive AFM probe.

Consequently, the results shown in FIGS. 5A to 5C for Example 1 were obtained.

Thus, the stable ON state (with a conductivity of 1 S/cm or more) and OFF state (with a conductivity of 1×10$^{-3}$ S/cm or less) as described above were obtained, the switching from the ON state to the OFF state exhibited a constant threshold voltage of +5 V to +10 V, the switching from the OFF state to the ON state mainly occurred with a voltage of about −5 V to −10 V, and a switching speed was such that an ON/OFF ratio (a ratio of a conductivity in the ON state to that in the OFF state) was 10$^{17}$ to 10$^2$ at 1 µsec or less. The threshold voltage of the switching exhibited a tendency to increase as the film thickness increased. In the case where an information processing device for performing recording, reproduction, and the like of information by rotating a flat-plate recording medium is prepared by applying the principles of the scanning probe microscope, a relative speed of the probe to the recording medium is made constant, whereby the occurrence of resonance upon high-speed scanning and the decrease of a S/N ratio of reproduction signals can be avoided. Therefore, the foregoing device is allowed to become a highly reliable device that has a large capacity and is capable of high-speed response.

Figure 17:
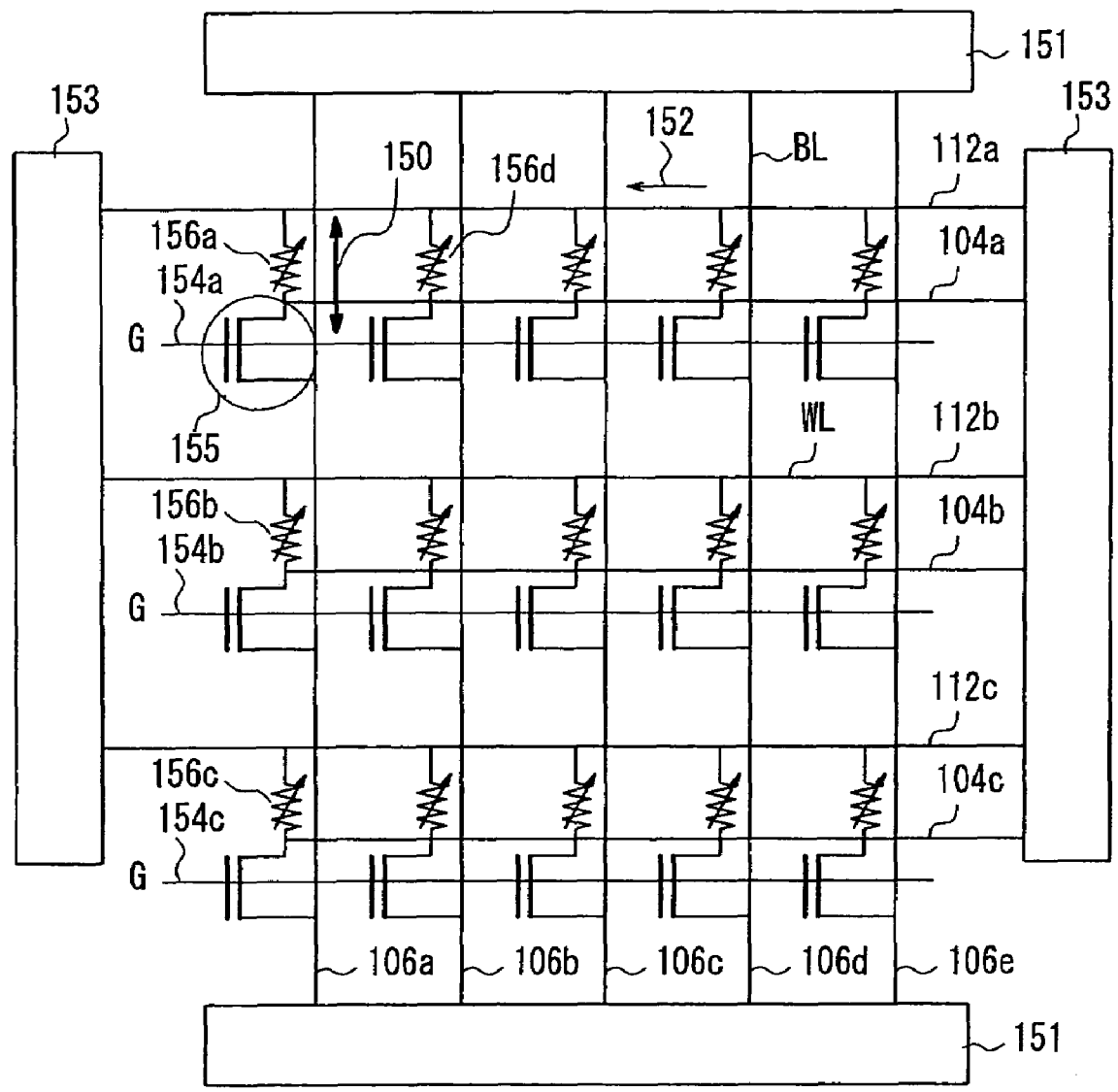
FIG. 17 is a wiring diagram for the nonvolatile memory part in Example 4 of the present invention.

Next, a wiring diagram of a nonvolatile memory according to the present example is described, with reference to FIG. 17. 156a to 156d denote conductive organic thin films, 155 denotes a MOS transistor, 150 denotes vertical-direction current flowing through bit lines (vertical selection lines 106a to 106e), 152 denotes current flowing through word lines (horizontal selection lines 112a to 112c), 151 denotes a bit line control circuit, and 153 denotes a word line control circuit. BL denotes a bit line (source electrode), while WL denotes a word line (horizontal selection line). Ends on one side of the conductive organic thin films 156a to 156d are connected with ends on one side of the MOS transistors 155, while ends on the other side of the conductive organic thin films 156a to 156d are connected with the word lines WL.

Upon polymerization, the vertical selection lines 106a to 106e are grounded (earthed), while a high voltage, which is positive, is applied to the source electrode lines 104 in FIG. 12A. Further, when a positive voltage is applied to the source electrode lines 104, the contact parts 107 (word lines of the horizontal selection lines 112a to 112c) are grounded. When this polymerization process is carried out, the SiO$_2$ film 111 may be formed beforehand. The polymerization may be carried out by using the source electrodes 104a to 104c as grounds and applying a positive voltage to the contact parts 107 and the vertical selection lines 106a to 106e. As to the polymerization environment, the polymerization may be carried out in water, or in the air. The polymerization is completed earlier if light is projected to the organic thin films during the polymerization.

Thereafter, the $SiO_2$ film 111 is formed, contact holes are formed by dry etching, and the horizontal selection lines 112a to 112c (word lines) shown in FIG. 17 are formed with a metal or the like.

With the present embodiment, a delay time occurring to the readout of information can be controlled to a nsec order. Therefore, it is possible to provide a memory from which information can be read out at a high speed.

For instance, when cells of the conductive organic thin films 156a and 156d are in an ON state (current flowing, already polymerized), since the cell of the conductive organic thin film 156a is in the ON state, the application of a voltage to the horizontal selection lines 112a causes a voltage to be applied to the gate electrodes G154a thereby turning the MOS transistor 155 on. This causes a current 150 to flow the bit line, thereby reaching the output. As a result, it is determined that the cell of the conductive organic thin film 156a is in the ON state (current flowing), and a bit of 1 is provided (reproduced state).

Here, when an inversed voltage (−X[V]) is applied across the word line of the horizontal selection line 112a and the source electrode line 104, the state makes a transition to a state in which current does not flow. In other words, even if a voltage is applied to the horizontal selection line 112a so that a voltage is applied to the gate electrode G154a to turn on the switch of the MOS transistor 155 as in the foregoing case, the current 150 is not generated in the bit line. Therefore, no current reaches the output, and a bit of 0 is provided. In other words, by treating an organic film as a variable resistor, the configuration can be treated as a nonvolatile memory. The MOS transistor 155 preferably is provided for preventing leakage current.

A ratio between the second and first conductivities of the organic film element preferably is large. The reason is that since there are differences in threshold voltages and gains of MOS transistors, it is desirable to use the organic film element having a large conductivity ratio, in order to identify information contents in the memory cell precisely.

Figure 18:
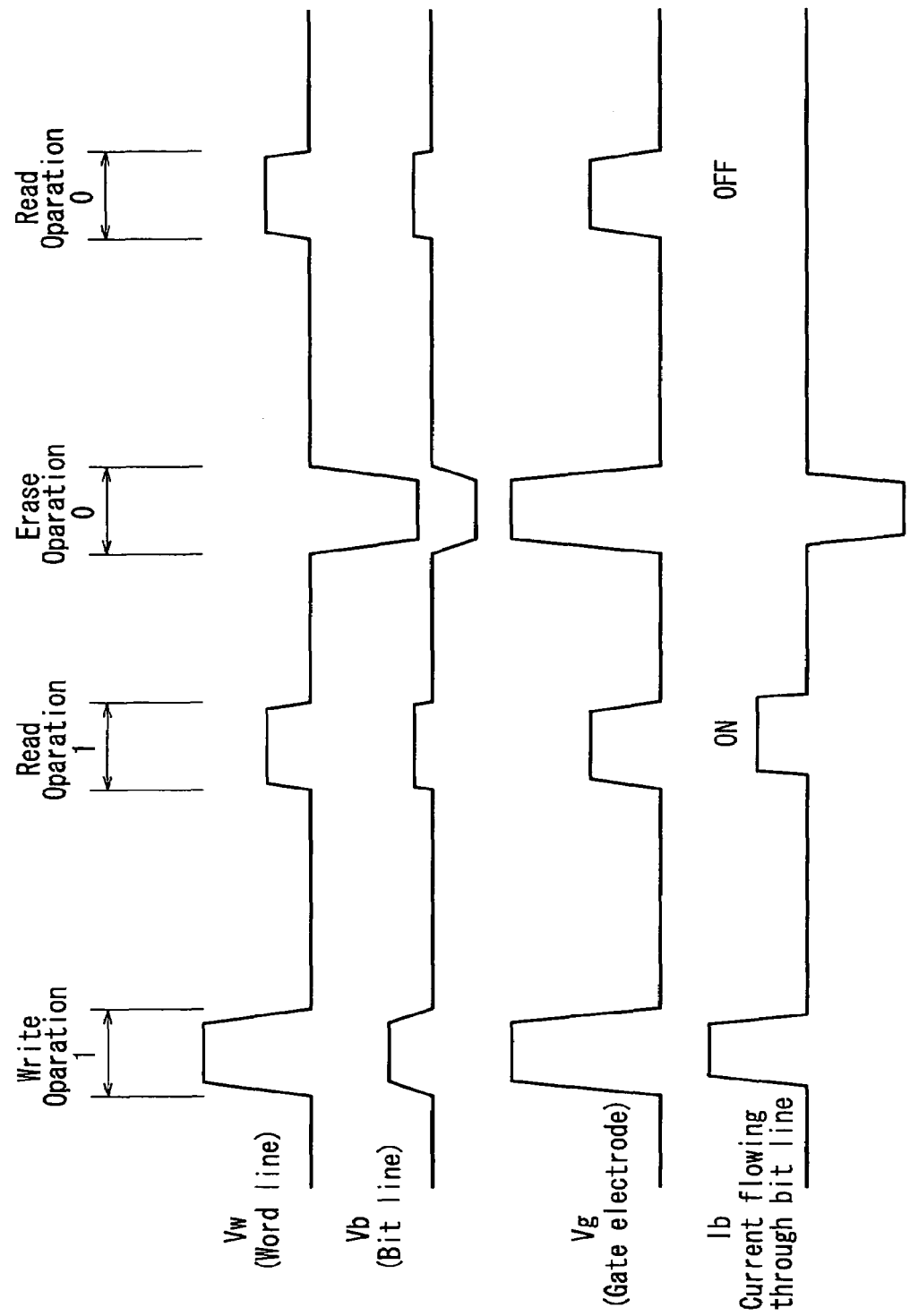
FIG. 18 is a motion diagram illustrating the nonvolatile memory of Example 4 of the present invention.

Next, an operation is described, with reference to FIG. 18. Here, a polymerization method without source electrode lines is described. When the polymerization is carried out, the bit lines (106a to 106e in FIG. 12A) are set so as to have approximately 5 V, a voltage of approximately 10 V is applied to word lines (horizontal selection lines 112a to 112c in FIG. 12A). Here, when a voltage of 20 V is applied to the gate electrodes Vg, a current of approximately 1 mA flows through the MOS transistors. Using this constant current, organic film elements can be polymerized (Write Operation, first from the left side in FIG. 18). To conduct this polymerization step, the $SiO_2$ film 111 desirably is formed before the film formation. As to the polymerization environment, the polymerization may be carried out in water, or in the air. The polymerization is completed earlier if light is projected to the organic thin films during the polymerization.

Next, a method for reproducing organic film elements (cells) in which the polymerization is completed is described. The bit lines (106 in FIG. 12A) are set to have approximately 0 V, and a voltage of approximately 3 V is applied to the word lines (horizontal selection lines). Here, when a voltage of approximately 10 V is applied to the gate electrodes, a current of approximately 0.05 mA flows through the MOS transistors. This causes a current to flow through the organic film elements, which lead to outputs to the bit lines (Read Operation, second from the left side in FIG. 18).

Next, after a strong electric field in an inversed direction is applied by flowing a current through the organic films in a direction inversed to the current flow during the previous polymerization, a state in which no current is allowed to flow can be achieved. More specifically, the bit lines (106 in FIG. 12A) are set to have approximately −5 V, and a voltage of approximately −10 V is applied to the word lines (horizontal selection lines 112). Here, when a voltage of 20 V is applied to the gate electrodes 102, a current of approximately −1 mA flows through the MOS transistors. This causes a state in which no current is allowed to flow through the organic film elements utilizing the foregoing constant current (Erase Operation, third from the left side in FIG. 18).

Once the state in which no current is allowed to flow is created, even if the respective voltages in FIG. 18, second from the left, are applied, zero current flows through the bit lines, and no output is obtained, whereby a bit of 0 is obtained (Read Operation, first on the right side in FIG. 18). Thus, without the lines 104, it is possible to conduct the polymerization utilizing a constant current, or to create a state in which no current is allowed to flow.

Example 5

Device structures shown in FIGS. 19 to 27 may be formed as applied examples of Example 4.

Figure 19:
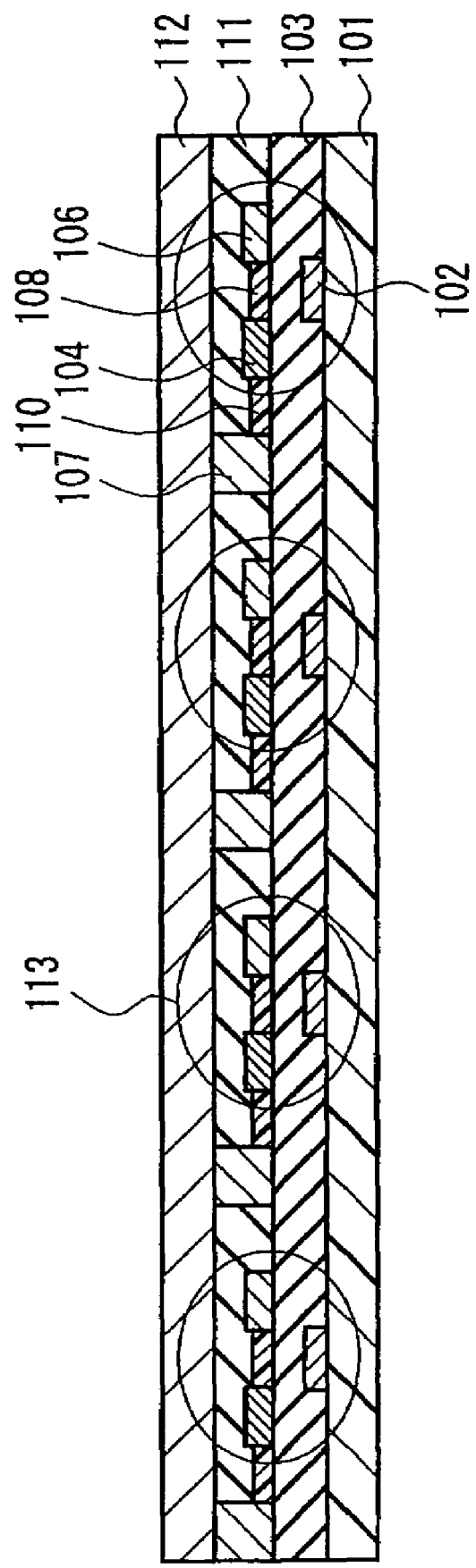
FIG. 19 is a cross-sectional view illustrating a nonvolatile memory element of Example 5 of the present invention.

First, as shown in FIG. 19, gate electrodes 102 are formed with a conductive material on a substrate 101. The material may be a metal material with a high conductivity, such as gold, silver, copper, platinum, or tungsten. Subsequently, an insulation film made of $SiO_2$ or the like is formed so as to have a thickness of 50 nm. Then, on a surface of the $SiO_2$ film 103 thus formed, source electrodes 104 and drain electrodes 106 are formed by metal mask or photolithography.

Next, conductive organic films are formed by adsorption on portions where $SiO_2$ is exposed, other than the drain electrodes 106 and the source electrodes 104. Thereafter, an insulation film 103 such as $SiO_2$ is formed so as to have a thickness of 100 nm in the same manner. Subsequently, etching is carried out to a depth of approximately 100 nm, i.e., to the conductive organic films thus formed, by using a dry etching device. This etching is intended to provide holes as contact holes 107 for connection with horizontal selection lines 112 formed by vapor deposition via the foregoing organic films. After the contact holes are formed, the horizontal selection lines 112 are formed by coating, vapor deposition, or the like. Here, it is desirable that the horizontal selection lines 112 are formed so as to cross the source electrodes 104 and the drain electrodes 106 substantially orthogonally.

As the conductive organic films (monomolecular films) 108 and 110, thin films may be used that are composed of chemisorption molecules containing conjugate groups selected from, for instance, those functioning in forming polyacethylene, polydiacetylene, polyacene, polypyrrole, and polythienylene, and functional groups that can be bound with a surface of a substrate by covalent bonds.

It should be noted that an alkyl group with an appropriate length may be introduced in a pyrrolyl group or a thienyl group, and further, a polar functional group, for instance, an oxycarbonyl group, may be introduced between a pyrrolyl group or thienyl group and silicon. An ethynyl group may be used if it can be bound by a conjugate bond. Alternatively, other than those materials, materials whose molecule has a chemical structure having at least a part with a π electronic level as an electronic state or a part with a σ electronic level as an electronic state may be used. Examples of an applicable coating method include vapor deposition, coating with a spin coater, coating by a sol-gel process, and coating by immersion in a solution. Further, the organic films thus coated may be aligned by a rubbing process. As an aligning method other than the rubbing process, a polarized light may be projected to the organic films that are configured so as to have a photoresponsive functional group, whereby organic films may be aligned in the polarization direction. Alternatively, as another aligning method, when the coating is carried out by immersion in a solution, the substrate may be lifted up while being tilted at a predetermined tilt angle with respect to a liquid level thereof, whereby the organic films are aligned in the draining direction. In the organic films, optionally, conjugate-bondable portions thereof may be polymerized by catalytic polymerization, electrolytic polymerization, or energy beam polymerization with X rays, electron beams, UV rays or the like. Thereafter, after laminating an insulation film 103, horizontal selection lines 112, an insulation film 103, and source electrodes 104 may be formed further successively, whereby memory cells, or a nonvolatile memory, having a three-dimensional structure can be produced.

Figure 20:
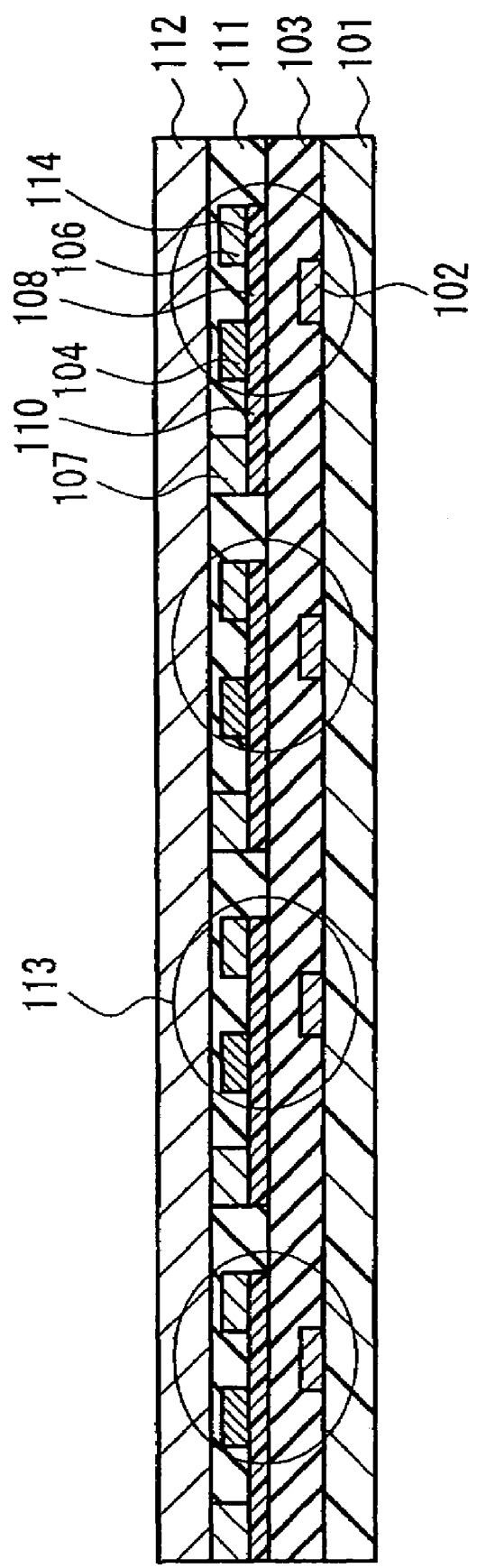
FIG. 20 is a cross-sectional view illustrating another nonvolatile memory element of Example 5 of the present invention.

FIG. 20 shows an example in which the conductive organic thin films of Example 4 described above are formed on an insulation film 103, on which contact electrodes 107, source electrodes 104, and drain electrodes 106 are formed further.

Figure 21:
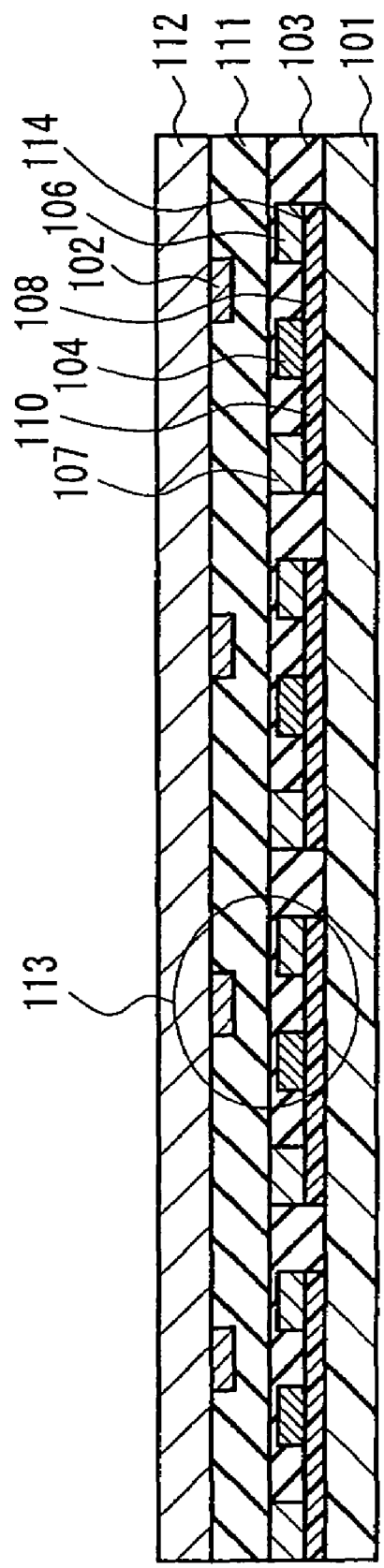
FIG. 21 is a cross-sectional view illustrating still another nonvolatile memory element of Example 5 of the present invention.
Figure 22:
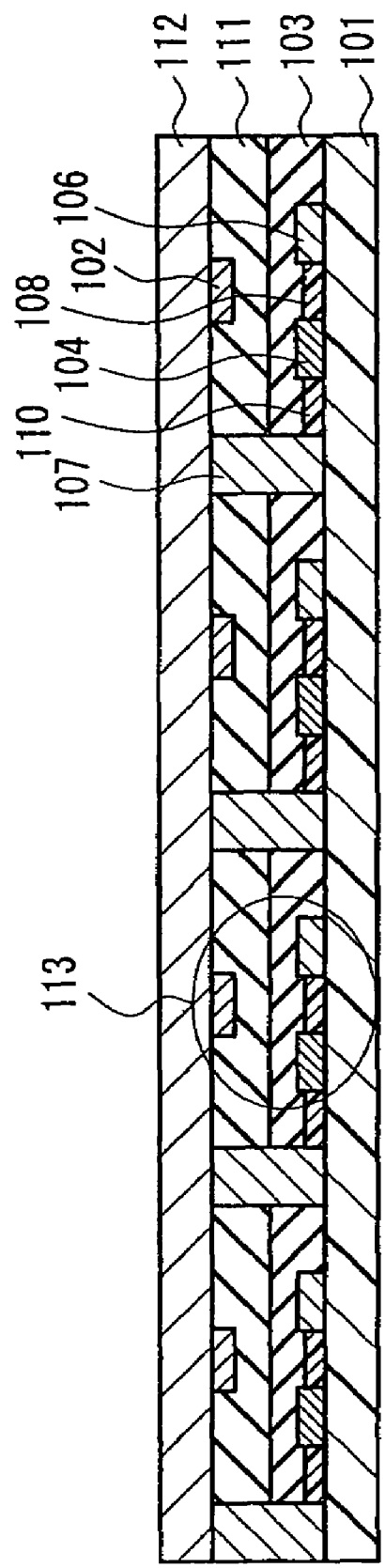
FIG. 22 is a cross-sectional view illustrating still another nonvolatile memory element of Example 5 of the present invention.

FIGS. 21 and 22 show examples in which gate electrodes 102 are formed above source electrodes 104 and drain electrodes 106.

Figure 23:
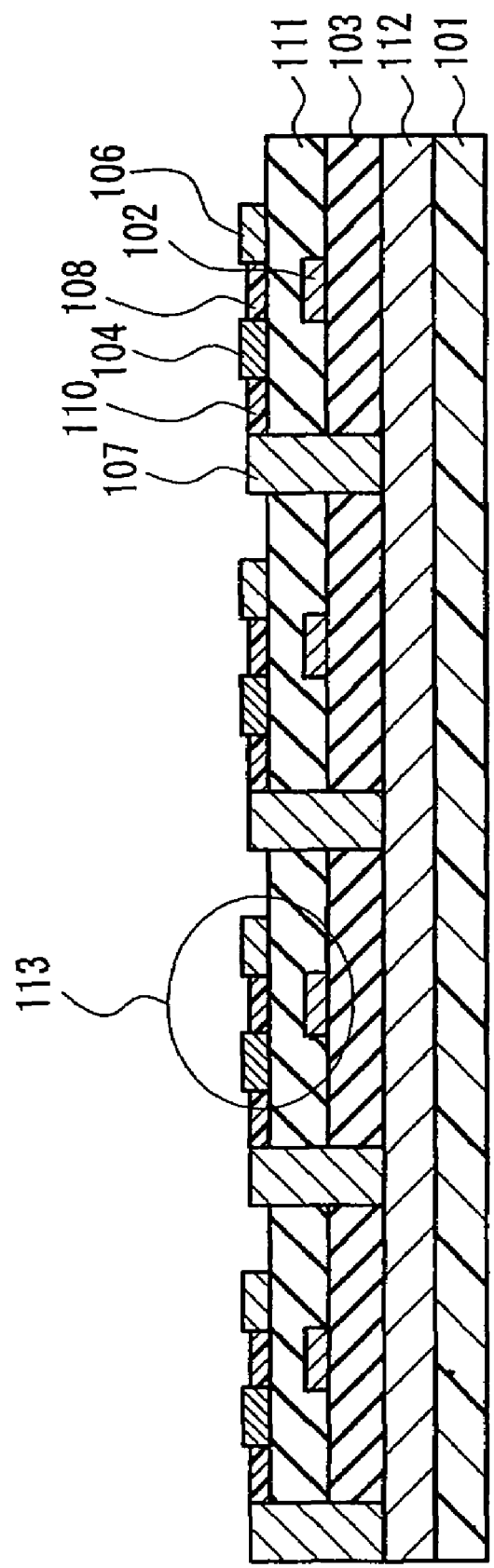
FIG. 23 is a cross-sectional view illustrating still another nonvolatile memory element of Example 5 of the present invention.
Figure 24:
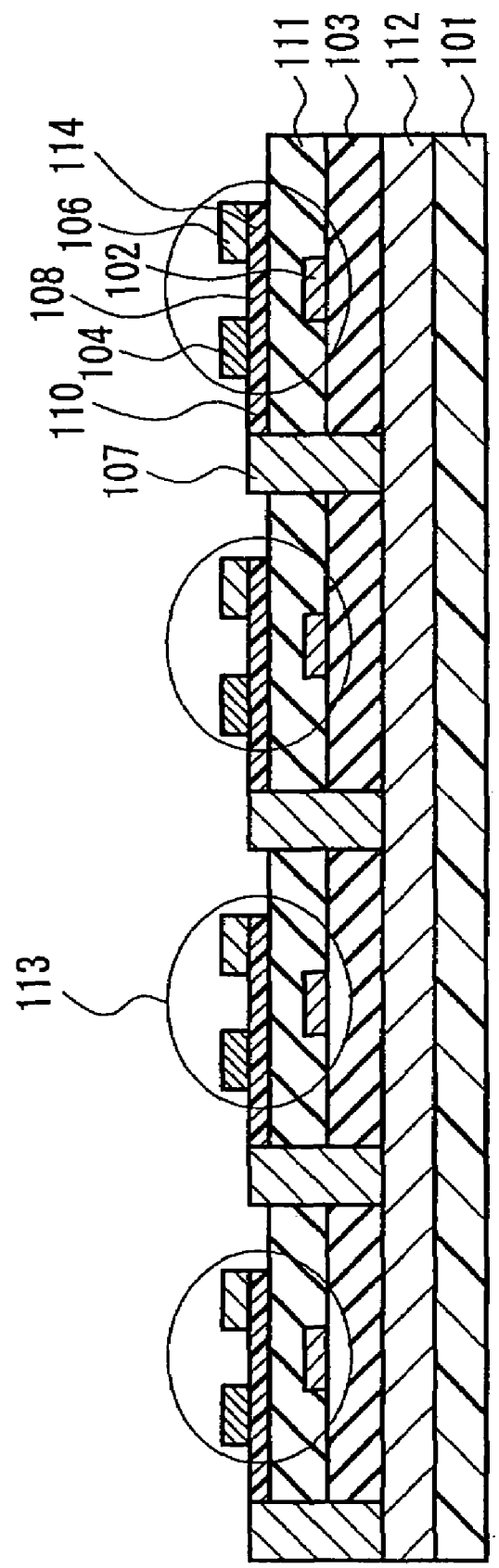
FIG. 24 is a cross-sectional view illustrating still another nonvolatile memory element of Example 5 of the present invention.

FIGS. 23 and 24 show examples in which contact electrodes 107, source electrodes 104, drain electrodes 106, and conductive organic thin films 108 and 110 are formed in a top part.

Figure 25:
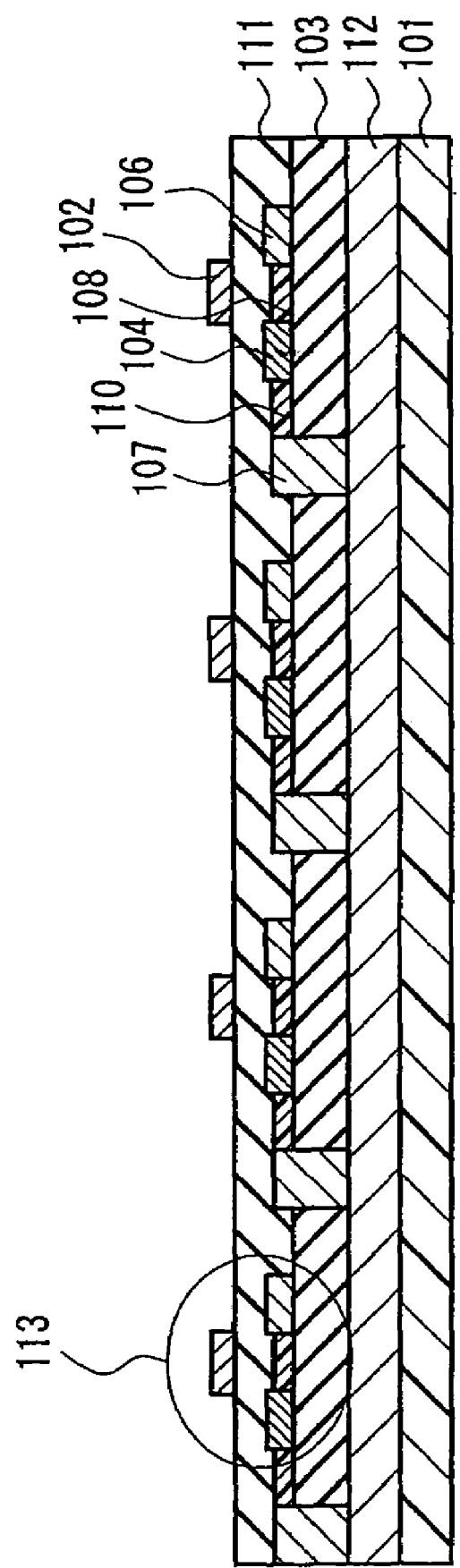
FIG. 25 is a cross-sectional view illustrating still another nonvolatile memory element of Example 5 of the present invention.
Figure 26:
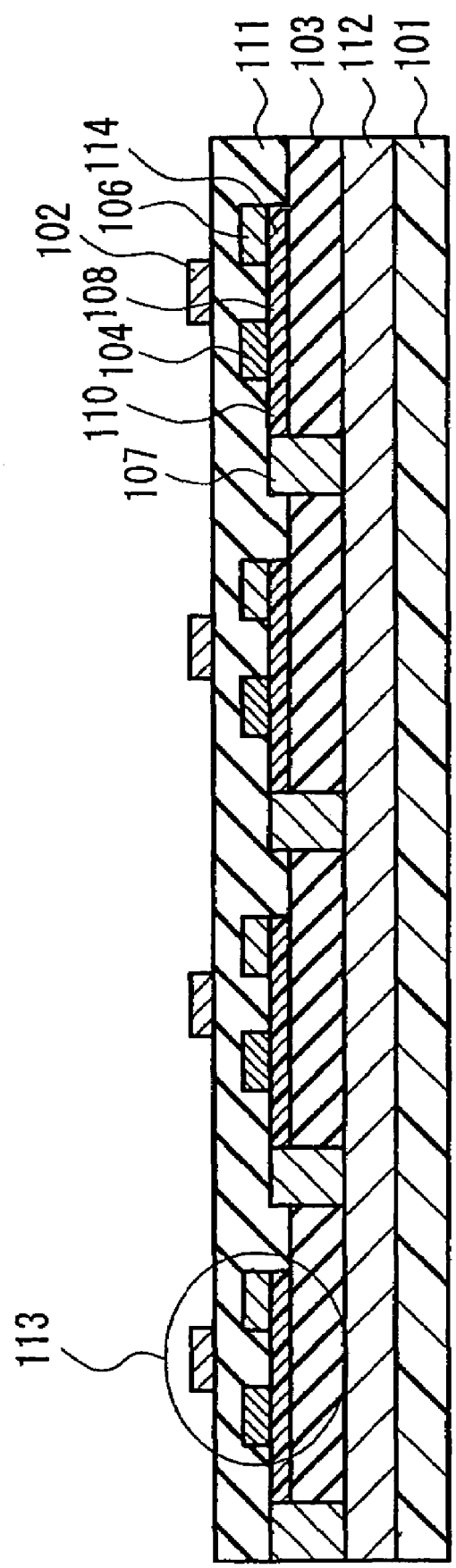
FIG. 26 is a cross-sectional view illustrating still another nonvolatile memory element of Example 5 of the present invention.

FIGS. 25 and 26 show examples in which gate electrodes 102 are formed on a top part.

Figure 27:
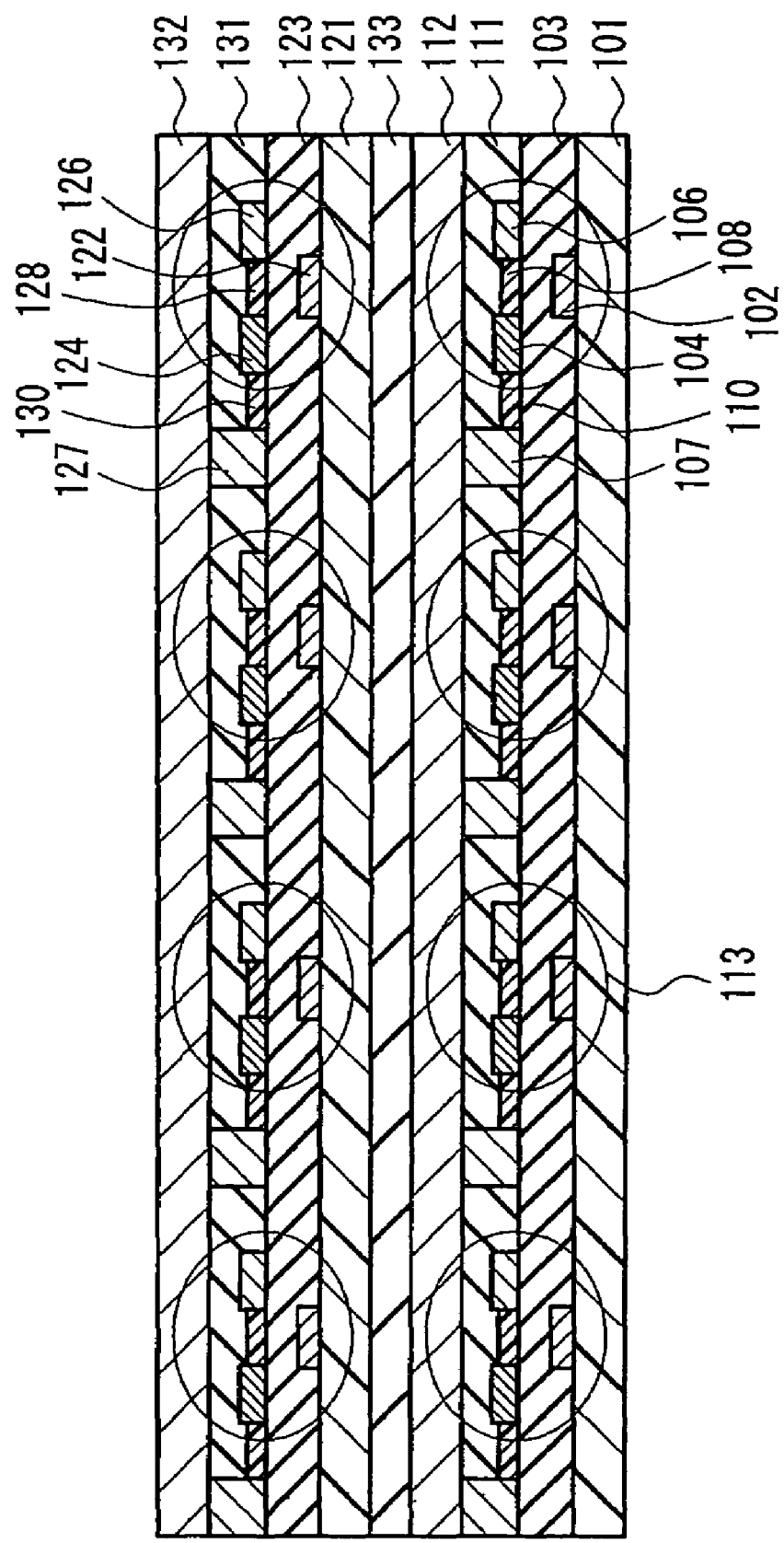
FIG. 27 is a cross-sectional view illustrating still another nonvolatile memory element of Example 5 of the present invention.

FIG. 27 shows an example in which gate electrodes 102 are formed on a substrate 1, an insulation film 103 is formed thereon, contact electrodes 107, source electrodes 104, and drain electrodes 106 are formed thereon, conductive organic thin films 108 and 110 are formed thereon, an insulation film 111 is formed thereon, and horizontal selection lines are formed thereon; likewise, gate electrodes 122 are formed on a substrate 121, an insulation film 123 is formed thereon, contact electrodes 127, source electrodes 124, and drain electrodes 126 are formed thereon, conductive organic thin films 128 and 130 are formed thereon, an insulation film 131 is formed thereon, and horizontal selection lines 132 are formed thereon; and these are laminated via an intermediate layer 133 so as to form a laminate structure. The structure is not limited to the two-layer structure, and a multilayer structure having not less than two layers can be formed.

Example 6

Through a synthetic process described above, {6-[(3-thienyl)hexyl-12,12,12-trichloro-12-siladodecanoate]} (TEN) expressed by a chemical formula (22) shown below was synthesized.

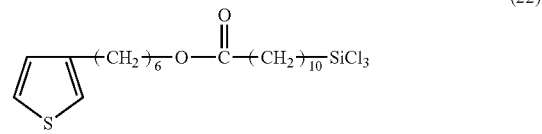

(22)

Organic films were formed in the same manner as that in Example 1 using the foregoing compound. Polythienyl-type organic conductive films obtained are expressed by a chemical formula (23) shown below.

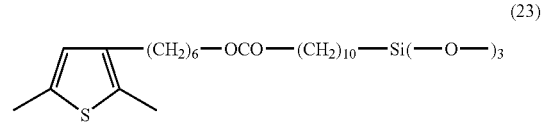

(23)

To observe the foregoing phenomenon, operations of recording, reading, and reproduction were experimented using a scanning tunneling microscope (STM) and a conductive stylus of an atomic force microscope (AFT), in the same manner as that of Example 1. Consequently, the results shown in FIGS. 5A to 5C were obtained as in Example 1.

Further, the stable ON state (with a conductivity of 1 S/cm or more) and OFF state (with a conductivity of $1 \times 10^{-3}$ S/cm or less) as shown in FIG. 1 was obtained, the switching from the ON state to the OFF state exhibited a constant threshold voltage of +5 V to +10 V, the switching from the OFF state to the ON state mainly occurred with a voltage of about −5 V to −10 V, and a switching speed was such that an ON/OFF ratio (a ratio of a conductivity in the ON state to that in the OFF state) was $10^{17}$ to $10^2$ at 1 μsec or less.

Example 7

Figure 29:
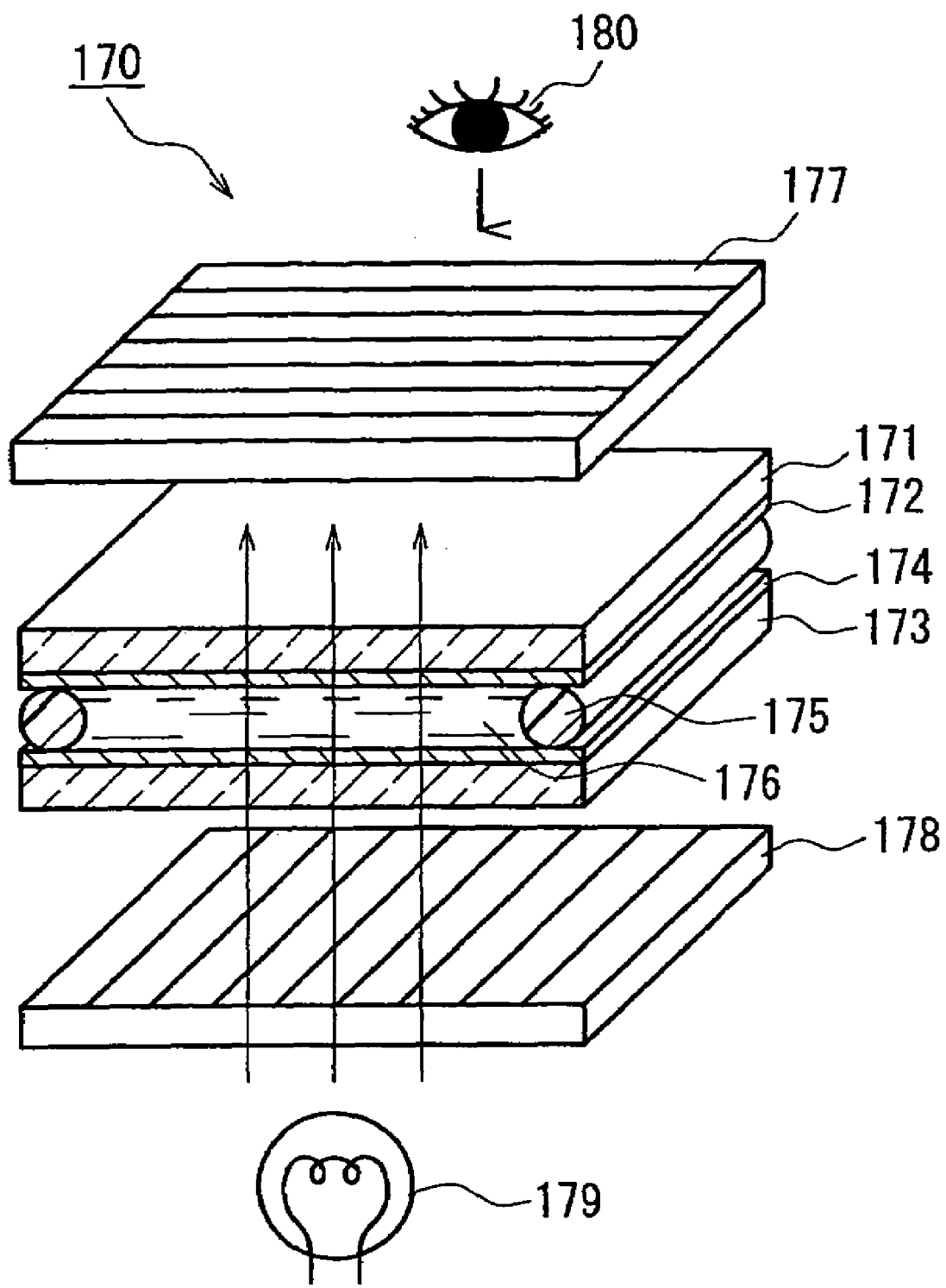
FIG. 29 is a perspective view illustrating a method for measuring molecular alignment in an example of the present invention.

Whether or not the conductive molecules were aligned or not in Examples 1 to 6 was checked by, as shown in FIG. 29, forming a liquid crystal cell 170, interposing the same between polarizing plates 177 and 178, projecting light thereto from a back side thereof, and observing the same at a position 180. The liquid crystal cell 170 was prepared by holding glass plates 171 and 173 provided with conductive molecular films 172 and 174, respectively, in a manner such that the conductive molecular films were disposed on inner sides with a gap distance of 5 to 6 μm therebetween, sealing the periphery thereof with an adhesive 175, and injecting a liquid crystal composition 176 (nematic liquid crystal, for instance, LC, MT-5087LA manufactured by CHISSO CORPORATION) into the gap.

(1) In the case where the polarizing plates 177 and 178 are placed so that their polarizing directions cross each other, alignment directions of the conductive molecular films 172 and 174 are directed in the same direction, and the polarizing direction of one of the polarizing plate is made parallel with the alignment direction, while the polarizing direction of the other polarizing plate is made orthogonal to the alignment direction. If the molecules are aligned completely, the liquid crystal is aligned, whereby a uniform black color is obtained. If a uniform black color is not obtained, it implies an alignment defect.

(2) In the case where the polarizing plates 177 and 178 are placed so that their polarizing directions are parallel with each other, alignment directions of the conductive molecular films 172 and 174 are directed in the same direction, and the polarizing directions of both of the polarizing plate are made parallel with the alignment direction. If the molecules are aligned completely, the liquid crystal is aligned, whereby a uniform white color is obtained. If a uniform black color is not obtained, it implies an alignment defect.

It should be noted that in the case where a substrate on the back side is not transparent, only one polarizing plate is arranged on an upper side, and light is projected from a front side thereof, so that observation is carried out using reflected light.

By these methods, it was confirmed that the conductive molecular films obtained in Examples 1 to 5 were aligned.

Industrial Applicability

As has been described above so far, the present invention not only allows writing/reading of record to be performed utilizing a change in an electrical resistance, but also enables dense packaging.

The invention claimed is:

1. A nonvolatile memory comprising:
at least a first electrode and a second electrode provided on a substrate, the first and second electrodes being separated from each other; and
a conductive organic thin film for electrically connecting the first and second electrodes,
wherein
the conductive organic thin film has a first electric state in which it exhibits a first resistance, and a second electric state in which it exhibits a second resistance,
a first threshold voltage for a transition from the first electric state to the second electric state, and a second threshold voltage for a transition from the second electric state to the first electric state are different from each other,
either the first electric state or the second electric state is maintained at a voltage in a range between the first threshold voltage and the second threshold voltage,
the conductive organic thin film is formed with organic molecules, each of which includes:
a terminal binding group that is bound with a surface of the substrate or a surface of an insulation layer on the substrate by a covalent bond; and
a conjugate group, and,
each conjugate group is polymerized with another conjugate group of another organic molecule so as to form the conductive organic thin film.

2. The nonvolatile memory according to claim 1,
wherein the first or second electric state is maintained by applying a predetermined voltage across the electrodes.

3. The nonvolatile memory according to claim 1,
wherein the first or second electric state also can be maintained by passing a predetermined current through the conductive organic thin film.

4. The nonvolatile memory according to claim 1,
wherein the first and second electrodes may be formed either substantially orthogonally with other or in matrix form.

5. The nonvolatile memory according to claim 1,
wherein the conjugate group of the conductive organic thin film is at least one conjugate group selected from conjugate groups that function in forming polypyrrole, polythienylene, polyacethylene, polydiacetylene, and polyacene.

6. The nonvolatile memory according to claim 1,
wherein the terminal binding group of the conductive organic thin film forms at least one type of bond selected from a siloxane-type (—SiO—) bond and a SiN— type bond where Si and N may have other binding groups equivalent to their valences.

7. The nonvolatile memory according to claim 1,
wherein the conductive organic thin film is aligned.

8. The nonvolatile memory according to claim 1,
wherein a molecular unit composing the conductive organic thin film is expressed by a chemical formula (A) given as:

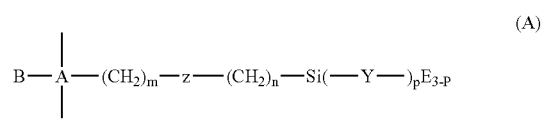

(A)

where
B represents hydrogen, an organic group including an alkyl group having one to ten carbon atoms, an active hydrogen introducible group, or its residue,
A represents at least one conjugate bond selected from a pyrrole group, a thienylene group, an acetylene group, and a diacetylene group,
Z represents at least one functional group selected from an ester group (—COO—), an oxycarbonyl group (—OCO—), a carbonyl group (—CO—), a carbonate group (—OCOO—), and an azo group (—N═N—), or a chemical bond (—),
m and n represent integers satisfying $2 \leq m+n \leq 25$,
Y represents oxygen (O) or nitrogen (N),
E represents hydrogen or an alkyl group having one to three carbon atoms, and
p represents an integer of 1, 2, or 3.

9. The nonvolatile memory according to claim 1,
wherein the conductive organic thin film is connected with a diode.

10. The nonvolatile memory according to claim 9,
wherein the diode is a PN junction film.

11. The nonvolatile memory according to claim 1,
wherein a ratio of a first conductivity in the second electric state to a second conductivity in the first electric state is $10^2$ to $10^{17}$.

12. The nonvolatile memory according to claim 1,
wherein the first electrode is a source electrode and the second electrode is a drain electrode,
the nonvolatile memory further comprising a gate electrode, a contact electrode, and a horizontal selection line,
wherein
the contact electrode is connected with the horizontal selection line,
the source electrode and the drain electrode are arranged to extend in a direction crossing the horizontal selection line orthogonally,
the gate electrode is arranged at a position above or below a region between the source electrode and the drain electrode, the position being apart 25 from the source electrode and the drain electrode,
the conductive organic thin films are arranged so as to electrically connect the contact electrode, the source electrode, and the drain electrode, and the conductive organic thin film arranged between the contact electrode and the source electrode forms a memory part.

13. The nonvolatile memory according to claim 12, wherein information is recorded utilizing a first conductivity for OFF and a second conductivity for ON, or contrarily, utilizing a first conductivity for ON and a second conductivity for OFF.

14. The nonvolatile memory according to claim 12, wherein a transition from the first conductivity to the second conductivity is caused by applying a predetermined voltage to or flowing a predetermined current through the conductive organic thin films.

15. The nonvolatile memory according to claim 12, wherein a ratio of a first conductivity in the second electric state to a second conductivity in the first electric state is $10^2$ to $10^{10}$.

16. The nonvolatile memory according to claim 12, wherein a transistor including the conductive organic thin films as an active layer, and the conductive organic thin film functioning as a memory are present on substantially the same plane.

17. The nonvolatile memory according to claim 1, wherein the conductive organic thin film is either a monomolecular film or a build-up film obtained by laminating monomolecular films.

18. The nonvolatile memory according to claim 1, wherein the conductive organic thin film has a conductivity ($\rho$) of not less than 1 S/cm at room temperature (25° C.) without a dopant.

19. The nonvolatile memory according to claim 18, wherein the conductive organic thin film has a conductivity ($\rho$) of not less than $1\times10^3$ S/cm at room temperature (25° C.) without a dopant.

20. The nonvolatile memory according to claim 19, wherein the conductive organic thin film has a conductivity ($\rho$) of not less than $5\times10^5$ S/cm at room temperature (25° C.) without a dopant.

21. The nonvolatile memory according to claim 1, wherein the conductive organic thin film further contains a dopant substance.

* * * * *

UNITED STATES PATENT AND TRADEMARK OFFICE
CERTIFICATE OF CORRECTION

| | | |
|---|---|---|
| PATENT NO. | : 7,027,327 B2 | Page 1 of 1 |
| APPLICATION NO. | : 10/486628 | |
| DATED | : April 11, 2006 | |
| INVENTOR(S) | : Yamamoto et al. | |

It is certified that error appears in the above-identified patent and that said Letters Patent is hereby corrected as shown below:

Column 31, line 60(claim4): "with other" should read --with each other--

Signed and Sealed this

Twenty-seventh Day of February, 2007

JON W. DUDAS
*Director of the United States Patent and Trademark Office*